US011965366B2

(12) United States Patent
Ney et al.

(10) Patent No.: US 11,965,366 B2
(45) Date of Patent: Apr. 23, 2024

(54) MODULAR ELECTRONIC CONTROL UNIT FOR VEHICLE LATCH AND VEHICLE LATCH WITH MODULAR ELECTRONIC CONTROL UNIT

(71) Applicant: Inteva Products, LLC, Troy, MI (US)

(72) Inventors: Daniel Alexander Ney, Lake Orion, MI (US); Donald Michael Perkins, Warren, MI (US)

(73) Assignee: INTEVA PRODUCTS, LLC, Troy, MI (US)

( * ) Notice: Subject to any disclaimer, the term of this patent is extended or adjusted under 35 U.S.C. 154(b) by 343 days.

(21) Appl. No.: 16/952,972

(22) Filed: Nov. 19, 2020

(65) Prior Publication Data
US 2021/0148143 A1 May 20, 2021

Related U.S. Application Data

(60) Provisional application No. 62/938,082, filed on Nov. 20, 2019.

(51) Int. Cl.
*E05B 81/76* (2014.01)
*E05B 81/06* (2014.01)
(Continued)

(52) U.S. Cl.
CPC .............. *E05B 81/76* (2013.01); *E05B 81/06* (2013.01); *G01R 33/072* (2013.01); *E05B 85/02* (2013.01)

(58) Field of Classification Search
CPC .......... E05B 81/06; E05B 81/12; E05B 81/14; E05B 81/15; E05B 81/16; E05B 81/18;
(Continued)

(56) References Cited

U.S. PATENT DOCUMENTS 5,360,351 A * 11/1994 Periou ................... E05B 85/02
439/304
8,534,101 B2 9/2013 Trush et al.
(Continued)

FOREIGN PATENT DOCUMENTS

CN 102162321 B 8/2011
CN 102170765 A 8/2011
(Continued)

OTHER PUBLICATIONS

First Chinese Office Action for Chinese Application No. 202011307973. 1; dated Dec. 17, 2021; 9 Pages.
(Continued)

*Primary Examiner* — Christine M Mills
*Assistant Examiner* — Christopher F Callahan
(74) *Attorney, Agent, or Firm* — CANTOR COLBURN LLP

(57) ABSTRACT

A vehicle latch system, including: a latch assembly; an electronic control unit removably attached to an exterior of a housing of the latch assembly, the electronic control unit having a printed circuit board assembly secured into a housing of the electronic control unit, wherein the printed circuit board assembly when inserted into the housing of the electronic control unit is press fit into electrical communication with a first pair of terminals molded into the housing of the electronic control unit, wherein the first pair of terminals are configured to have an interference fit with a second pair of terminals molded into a housing of the latch assembly when the electronic control unit is secured to the latch assembly.

10 Claims, 19 Drawing Sheets

(51) Int. Cl.
*G01R 33/07* (2006.01)
*E05B 85/02* (2014.01)
(58) Field of Classification Search
CPC .......... E05B 81/20; E05B 81/21; E05B 81/22;
E05B 81/64; E05B 81/66; E05B 81/68;
E05B 81/72; E05B 81/74; E05B 85/02;
Y10T 292/1047; Y10T 292/1082
See application file for complete search history.

(56) References Cited

U.S. PATENT DOCUMENTS

| | | |
|---|---|---|
| 9,518,408 B1 | 12/2016 | Krishnan |
| 9,725,929 B2 | 8/2017 | Picard et al. |
| 10,047,548 B2 | 8/2018 | Zeabari |
| 2004/0135378 A1* | 7/2004 | Buedding ............... E05B 81/68 292/216 |
| 2010/0007463 A1 | 1/2010 | Dingman et al. |
| 2015/0233152 A1* | 8/2015 | Vazquez ................ E05B 85/02 292/2 |
| 2015/0361694 A1* | 12/2015 | Zeabari .................. E05B 81/54 361/752 |
| 2016/0153212 A1 | 6/2016 | Bingle et al. |
| 2018/0334831 A1 | 11/2018 | Shyu et al. |
| 2019/0296466 A1 | 9/2019 | Lappoehn |

FOREIGN PATENT DOCUMENTS

| | | | |
|---|---|---|---|
| CN | 105525808 A | 4/2016 | |
| CN | 106168087 A | 11/2016 | |
| WO | WO-2015044323 A1 * | 4/2015 | ............. E05B 77/34 |

OTHER PUBLICATIONS

Chinese Search Report for Chinese Application No. 202011307973. 1; dated Sep. 9, 2022; 1 Page.

Second Chinese Office Action for Chinese Application No. 202011307973.1; dated Sep. 9, 2022; 11 Pages; English translation included.

* cited by examiner

MODULAR ELECTRONIC CONTROL UNIT FOR VEHICLE LATCH AND VEHICLE LATCH WITH MODULAR ELECTRONIC CONTROL UNIT

CROSS REFERENCE TO RELATED APPLICATIONS

This application claims the benefit of U.S. Provisional Patent Application Ser. No. 62/938,082 filed on Nov. 20, 2019, the contents of which are incorporated herein by reference thereto.

BACKGROUND

Exemplary embodiments of the present disclosure pertain to the art of vehicle latches and more particularly, a modular electronic control unit for a vehicle latch and a vehicle latch with a modular electronic control unit.

Electronic latches or E-Latches, or Smart Latches, require a very technical and sensitive circuit board to properly function the latch in all scenarios. For example, these latches employ electronically operated motors or actuators that perform functions of the latch, which in the past were manually operated through the use of cables and/or handles mechanically coupled to the latch. There are also many other actuators and modules that may be required for the latch and door system to function as well, such as cinch actuators, lockout actuators, door presenters, etc. Since these latches remove the release cables that allow for mechanical release of the system, it is critical that the circuit board will function at all times and can survive all conditions.

One solution is to have the electrical circuit carrier installed or mounted inside the latch, which typically requires a specific electrical circuit carrier (ECC) design for different latches, projects or applications, or to mount the electrical circuit carrier (ECC) elsewhere in the door that is remote from the latch and connect it to the latch via a wire harness. This becomes very expensive, due to the additional development, and required verification and testing of the systems, along with additional connectors, wires, etc. Moreover, the remoteness of the ECC may create issues if the vehicle door is damaged due to a collision and the wire harness is severed. These unique designs specific to one vehicle door platform also reduces the chances for serviceability, since the ECC is internal to the latch, which can become costly with the price of these systems.

If the electrical circuit carrier ECC (printed circuit board (PCB), components, and connector header) is directly mounted inside of the latch the latch housing must be sealed and the printed circuit board must be located on top of movable levers that hold magnets for Hall-effect sensing.

Hall-effect sensors can be used in latching systems as they require less mechanical electrical connections to the system, and also do not require a mechanical interface to the movable lever, which reduces potential failures. However, a Hall-effect sensor is activated depending on the magnetic field strength that is reads. For latching applications, it is imperative that the controller knows the position of the components inside the latch accurately. Using a traditional Hall-effect arrangement, the magnet is positioned with its polarity perpendicular to the sensor. This means that in a typical application the printed circuit board (PCB) must overlay the travel of the magnet in order to have the Hall-effect sensor located over the magnet. This creates limitations in the available space for the printed circuit board, and also will increase the package size in critical locations.

An alternate solution would be to put the printed circuit board on a different plane where space is not a concern, and to run a daughter board that has the sensors on it over top of the moveable levers with magnets. Another issue is the crashworthiness of the PCB, as when it is located parallel to the frame and retention assembly, it will be subject to severe damage in a crash scenario.

Since further, when the ECC is integrated within the latch assembly, serviceability becomes a difficult task, as the latch cover would potentially need to be removed in order to change out the electronics for repair and/or replacement, therefore the entire latch assembly would most likely need to be replaced.

Accordingly, it is desirable to provide an improved electrical control unit (ECU) that can be easily secured to an exterior of a latch housing for operation and control of the latch without the aforementioned drawbacks.

BRIEF DESCRIPTION

Disclosed is a vehicle latch system. The vehicle latch system including: a latch assembly; an electronic control unit removably attached to an exterior of a housing of the latch assembly, the electronic control unit having a printed circuit board assembly secured into a housing of the electronic control unit, wherein the printed circuit board assembly when inserted into the housing of the electronic control unit is press fit into electrical communication with a first pair of terminals molded into the housing of the electronic control unit, wherein the first pair of terminals are configured to have an interference fit with a second pair of terminals molded into a housing of the latch assembly when the electronic control unit is secured to the latch assembly.

In addition to one or more of the features described above, or as an alternative to any of the foregoing embodiments, the second pair of terminals are electrically coupled to a motor of the latch assembly.

In addition to one or more of the features described above, or as an alternative to any of the foregoing embodiments, the printed circuit board assembly includes a cover portion that is secured to an opening of the housing of the electronic control unit.

In addition to one or more of the features described above, or as an alternative to any of the foregoing embodiments, the cover portion and the housing of the electronic control unit is formed plastic.

In addition to one or more of the features described above, or as an alternative to any of the foregoing embodiments, the printed circuit board assembly has an integral source of power.

In addition to one or more of the features described above, or as an alternative to any of the foregoing embodiments, the integral source of power is a capacitor.

In addition to one or more of the features described above, or as an alternative to any of the foregoing embodiments, the capacitor is oriented horizontally with respect to the printed circuit board assembly, such that a height of the capacitor extends parallel to the printed circuit board assembly and a diameter of the capacitor extend perpendicular to the printed circuit board assembly.

In addition to one or more of the features described above, or as an alternative to any of the foregoing embodiments, a cover portion of the electronic control unit has a housing portion for the capacitor to be secured to.

In addition to one or more of the features described above, or as an alternative to any of the foregoing embodiments, a communication system between latch components of the latch assembly and Hall-effect sensors is located on the printed circuit board assembly.

In addition to one or more of the features described above, or as an alternative to any of the foregoing embodiments, the latch components are a first lever pivotally mounted to a back plate for rotation about a first axis and a second lever is pivotally mounted to the back plate for rotation about a second axis, the first axis being at a different location than the second axis.

In addition to one or more of the features described above, or as an alternative to any of the foregoing embodiments, the communication system further comprises a plurality of metal traces that transfer a magnetic field of a magnet located on the first lever to the Hall-effect sensors located on the printed circuit board assembly and a magnetic field of a magnet located on the second lever as the first lever pivots about the first axis and the second lever pivots about the second axis.

In addition to one or more of the features described above, or as an alternative to any of the foregoing embodiments, the metal traces are formed from steel.

In addition to one or more of the features described above, or as an alternative to any of the foregoing embodiments, the printed circuit board assembly is located in a plane offset or not parallel to a plane the magnets move in.

In addition to one or more of the features described above, or as an alternative to any of the foregoing embodiments, the second pair of terminals are electrically coupled to a motor of the latch assembly.

In addition to one or more of the features described above, or as an alternative to any of the foregoing embodiments, the printed circuit board assembly includes a cover portion that is secured to an opening of the housing of the electronic control unit.

In addition to one or more of the features described above, or as an alternative to any of the foregoing embodiments, the cover portion and the housing of the electronic control unit is formed plastic.

In addition to one or more of the features described above, or as an alternative to any of the foregoing embodiments, the printed circuit board assembly has an integral source of power.

In addition to one or more of the features described above, or as an alternative to any of the foregoing embodiments, the integral source of power is a capacitor.

In addition to one or more of the features described above, or as an alternative to any of the foregoing embodiments, the capacitor is oriented horizontally with respect to the printed circuit board assembly, such that a height of the capacitor extends parallel to the printed circuit board assembly and a diameter of the capacitor extend perpendicular to the printed circuit board assembly and a cover of the electronic control unit has a housing portion for the capacitor to be secured to.

Also disclosed is a method of communicating a location of a component of a latch assembly to an electronic control unit secured to an exterior of a housing of the latch assembly, the method including the steps of: molding a plurality of metal traces into a cover of the housing of the latch assembly; securing the electronic control unit secured to the exterior of the housing; and detecting a magnetic field of a magnet located on a component of the latch assembly via a Hall-effect sensor located on a printed circuit board assembly of the electronic control unit with one of the plurality of traces as the component moves within the latch assembly.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
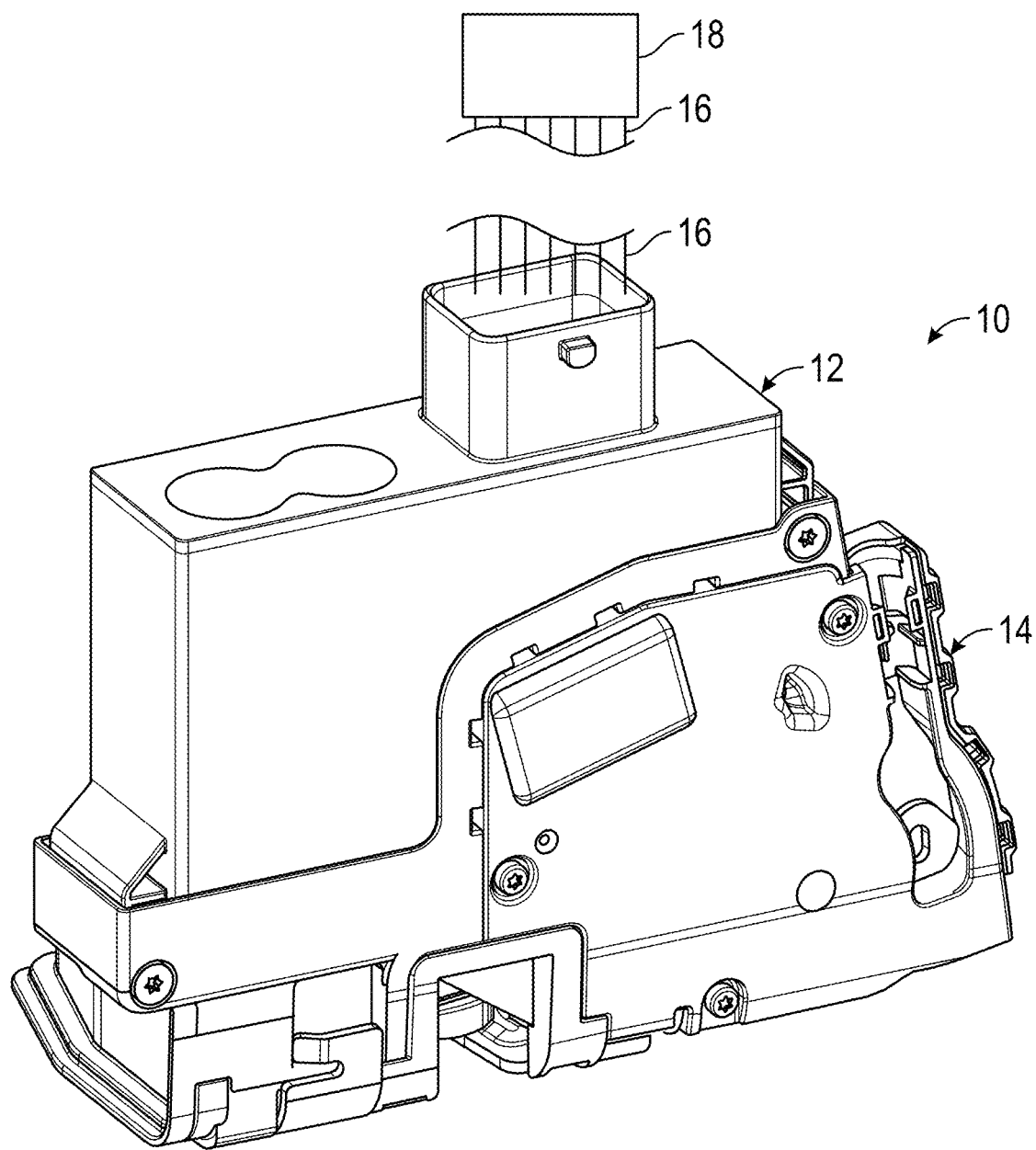
FIGS. 1-2 are perspective views of a modular electronic control unit (ECU) or electronic control unit (ECU) secured to a vehicle latch or latch assembly.
Figure 2:
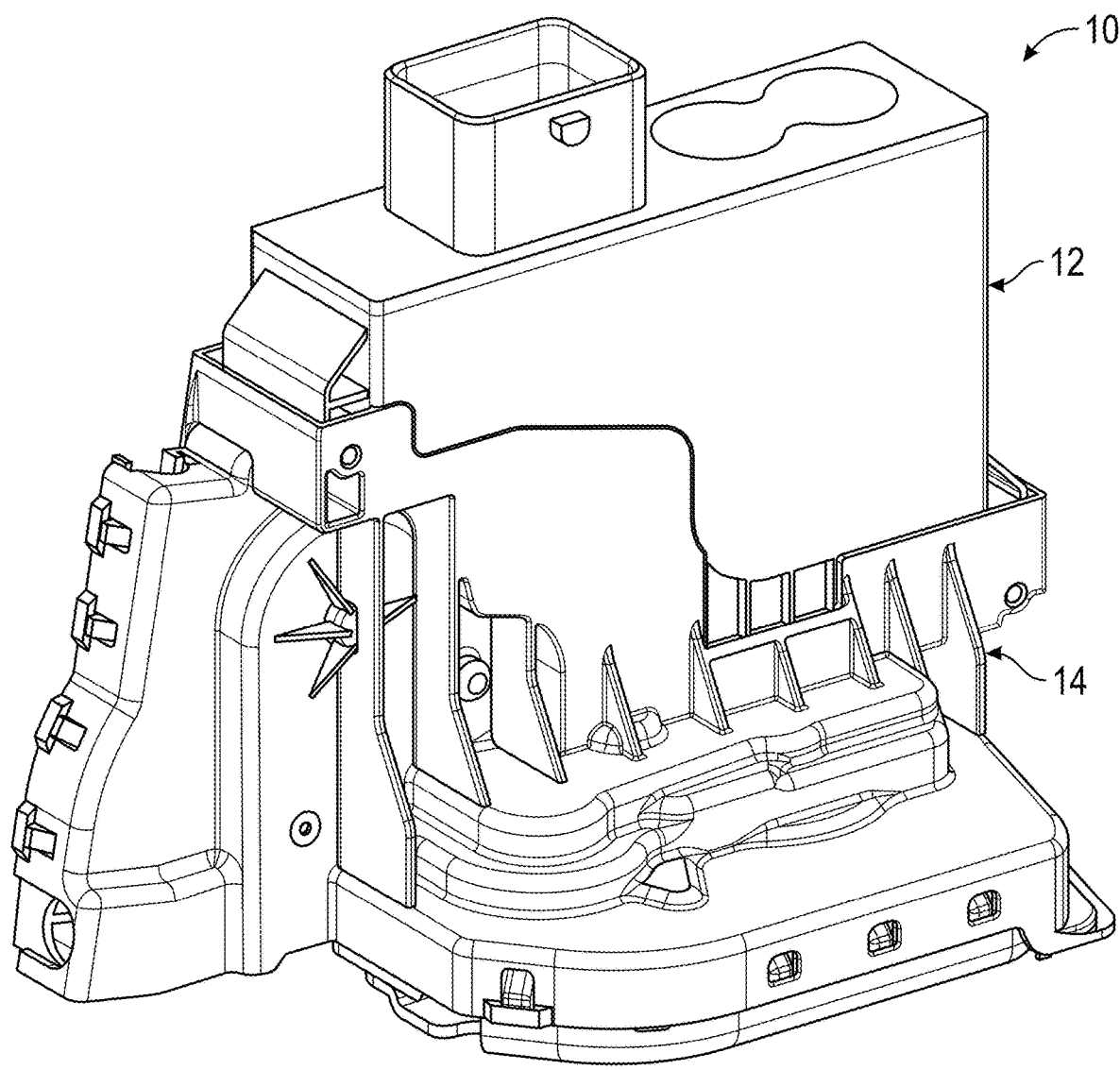

The present disclosure is directed to a modular electronic control unit or electronic control unit (ECU) for attachment to a vehicle latch assembly and/or a vehicle latch system comprising the modular electronic control unit or the electronic control unit (ECU) and the vehicle latch assembly. In one embodiment, the modular electronic control unit (ECU) is configured to be attached to the latch assembly at the end of line or in other words when the latch assembly is fully assembled. As such, the latch assembly itself would be fully built, with only the release (or any additional) motor within it, and no other electrical connection is required. In accordance with the present disclosure, the modular electronic control unit (ECU) itself is a separate fully sealed component capable of having an Ingress Protection IP67. An IP67 rating means that the item is protected from water ingress in a body of water up to a depth of 1 meter for one half of an hour. Still further, the only electrical connection points to the latch are for the motor, which reduces the overall number of potential fault points at these connections.

As such, one approach for the present disclosure is to have a sealed housing and cover for the circuit board that can attach to and communicate with the latch. In one embodiment, the modular electronic control unit (ECU) enclosure, is a sealed enclosure that houses all of the electronic components (excluding the motor(s)) required for latch communication and controls.

The modular electronic control unit (ECU) module is securely attached onto the cover of the latching system in a location that best suits the particular vehicle environment.

In order to provide power to the motor(s), the electronic control unit ECU enclosure has over-molded terminals that are press fit to the printed circuit board during assembly of the printed circuit board into the ECU, and these terminals protrude outside of the ECU housing, while the latch cover has over-molded terminals that connect to the motor, and protrude out of the latch cover. When assembled these terminal have a press fit interface connection with a sealed connector shroud around them to keep water out, allowing for a sealed connection between the modular electronic control unit (ECU) and the Latch.

Another feature of the present disclosure is the communication system between the latch components and Hall-effect sensors located on an electronic circuit carrier (ECC) or printed circuit board (PCB) located within the electronic control unit (ECU). In one embodiment magnets are directly mounted on movable levers internal to the latch. The positions of these movable levers are required to be known by electronic control unit (ECU) thus, they require sensing. Instead of locating the magnets directly underneath the Hall-effect sensor(s) of the electronic control unit (ECU), they move underneath steel (or other ferrous material) traces. These traces are over-molded into the latch cover (or additional carrier component) and are designed to cover the travel of the magnet where signal change is required. As such, the steel (or other ferrous material) traces transfer the magnetic field and location thereof to the Hall-effect sensors.

For example, a trace would cover a portion of the travel of the magnet, and then extend off to a location where the Hall-effect sensor is able to pick up the magnet field coming off of the trace when it becomes magnetized, by movement of the lever the magnet is secured to. This means that although the printed circuit board (PCB) of the electronic control unit (ECU) may be on a different plane, or in an offset location from the magnets or in a plane not parallel to the plane the magnets move in, it can still detect the change in magnetic field as the lever moves into various positions.

Another feature of the present disclosure is that the electronic control unit (ECU) includes a source of internal power such as super capacitors for power backup. To decrease the overall size of the enclosure assembly of the electronic control unit (ECU), the capacitors may oriented horizontally to the printed circuit board (PCB) and/or they may be retained in the cover of the electronic control unit (ECU). This allows for height of the package of the electronic control unit (ECU) to increase only by the diameter of the capacitors as opposed to their height, which can be 2-3 times larger than the diameter. The cover of the electronic control unit (ECU) acts as a cartridge for the super capacitors where they are sealed, potted, or glued into place, and then the terminals are bent 90 degrees and soldered to the printed circuit board (PCB) or alternatively they can be connected using a bus bar or other connection method.

In one embodiment, the modular electronic control unit or electronic control unit (ECU) may be referred to as comprising a sealed housing and cover with a circuit board located therein. The circuit board will comprise electronics that are configured to communicate the latch and in other embodiments other components of the vehicle, which may be located in the door of the vehicle or elsewhere. As such, a modular electronic control unit (ECU) is provided that can attach to and communicate with a latch. The modular electronic control unit (ECU) will negate the need to directly mount an electrical circuit carrier (ECC) and its associated electronics inside the housing of the latch, or to design individual latches with specific ECCs intended for different projects or applications.

In accordance with various embodiments of the present disclosure a common electronic control unit (ECU) design is provided that allows it to integrate with a variety of different latching systems, and provides the ability to use a common electronic control unit (ECU) for a front, rear, driver side, passenger side, compartmental latches, or common to all door applications.

The electronic control unit's circuit board itself can provide a variety of different options for the system, whether it is providing just the standard controls for an E-Latch, or controlling the other modules of, and around, the latch such as cinching actuators, lockout actuators, door presenters, or even all the functionality of the door control unit (DCU). Using this logic, an end user can obtain a single electronic control unit (ECU) design with the functions they require, and they can use the same ECU on all, or multiple, doors of the vehicle.

This ECU and its associated latch can be implemented onto any latch type within the vehicle, such as side door, liftgate, compartmental, hood, truck, frunk (e.g., a storage compartment located at the front of the vehicle), etc.

Figure 3:
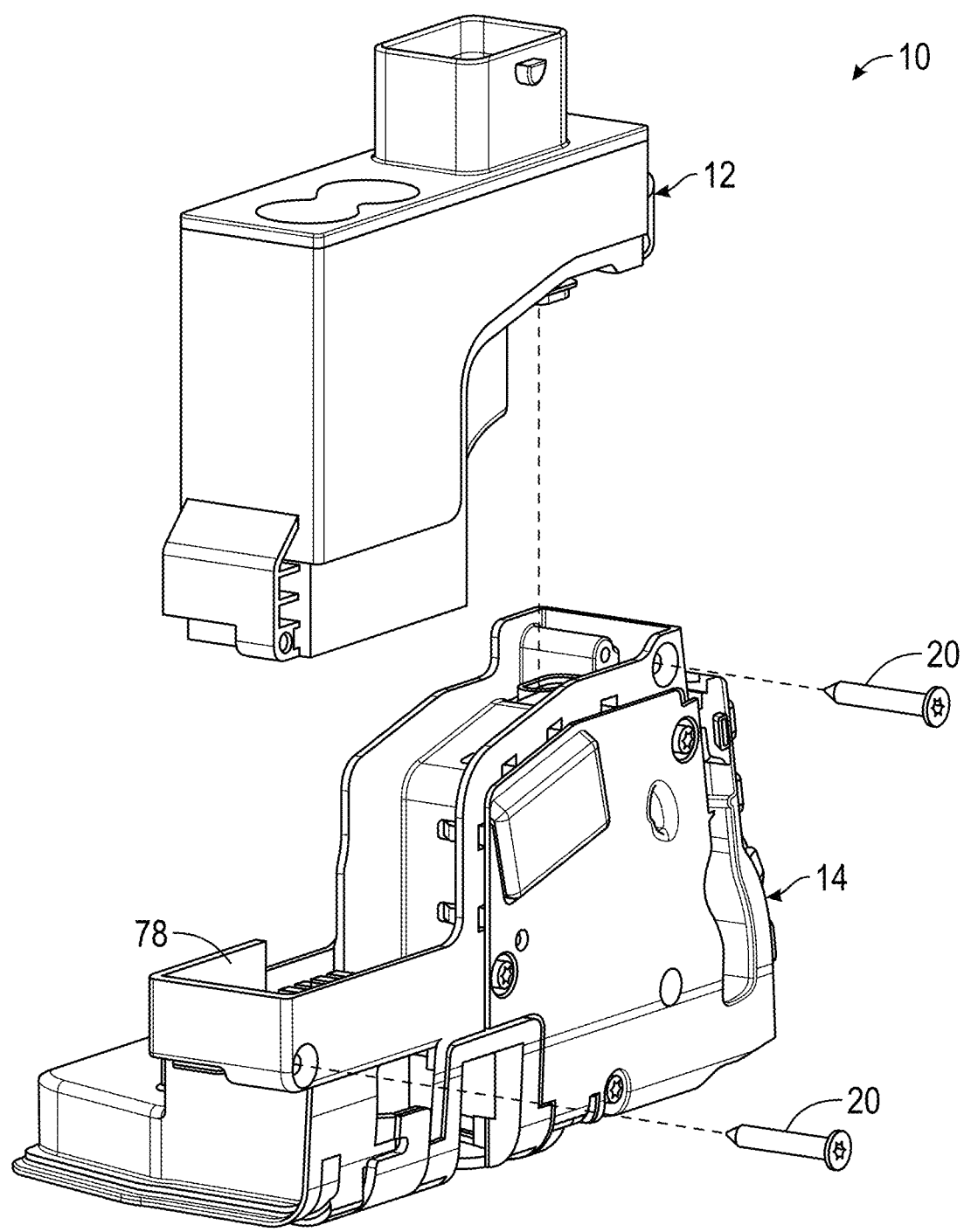
FIG. 3 illustrates the electronic control unit (ECU) being secured to the vehicle latch.
Figure 6:
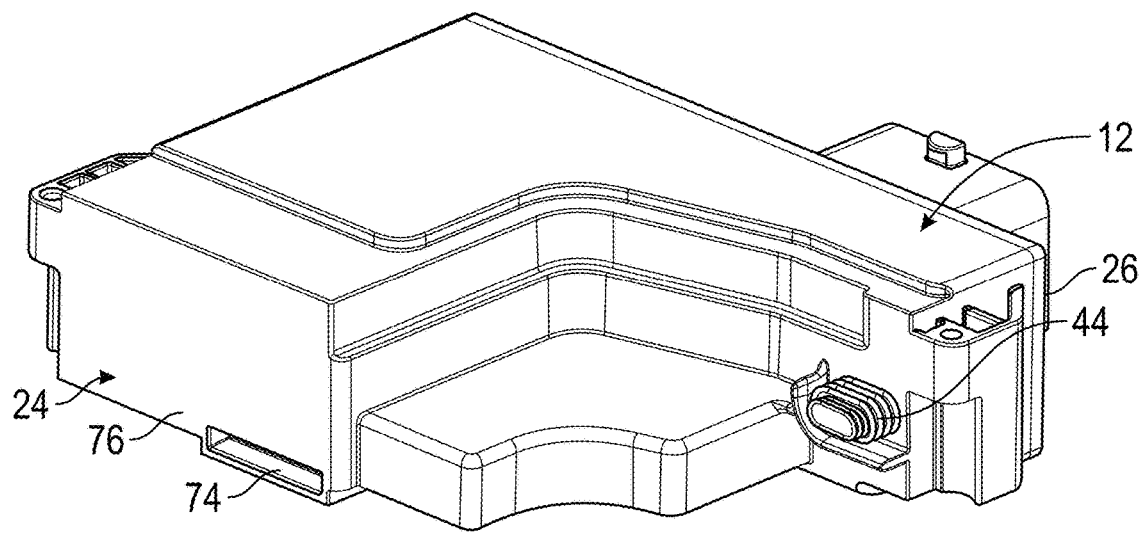
FIGS. 6 and 7 are perspective views of a modular electronic control unit (ECU) or electronic control unit (ECU) secured to a vehicle latch or latch assembly.
Figure 7:
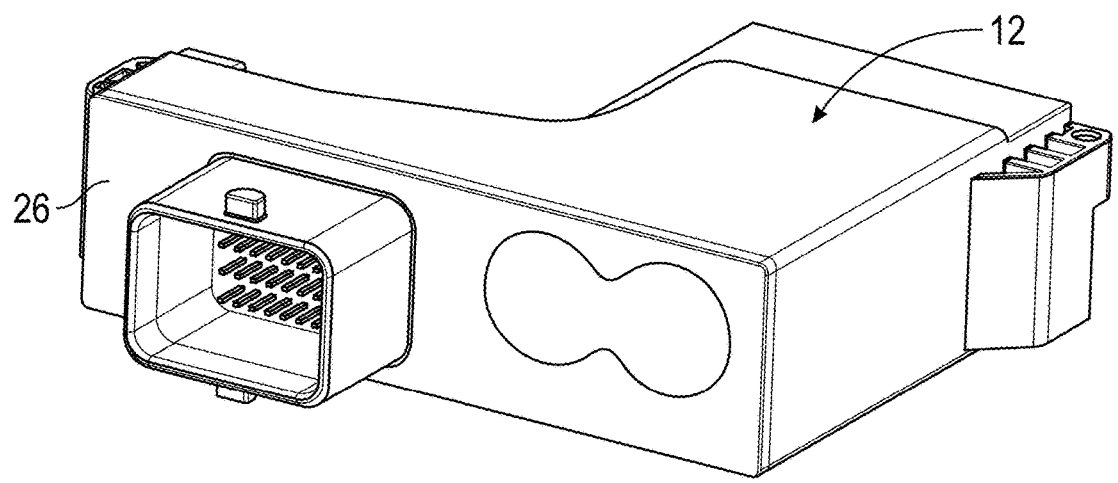

FIGS. 1-5 illustrate a vehicle latch system 10 including a modular electronic control unit (ECU) or electronic control unit (ECU) 12 secured to a vehicle latch or latch assembly 14. In accordance with the present disclosure the modular electronic control unit (ECU) or electronic control unit (ECU) 12 is removably secured to an exterior housing of the vehicle latch or latch assembly 14 FIGS. 6 and 7 are views of the electronic control unit (ECU) 12 and FIG. 3 illustrates the electronic control unit (ECU) 12 being secured to the vehicle latch 14.

In one non limiting embodiment, wires 16 may be operably coupled to a vehicle door unit controller 18 (illustrated schematically in at least FIG. 1) of a vehicle door system, which may be configured to operate other features of the door such as a window regulator, side view mirrors, lighting, ect. As will be mentioned below and in an alternative embodiment, these other features may also be controlled by the electronic control unit 12. Alternatively, box 18 may represent anyone of a plurality of sensors located with the vehicle, which provide operation signals to the electronics of the electronic control unit 12.

FIG. 3 illustrates the electronic control unit 12 being secured to an exterior housing of the latch assembly 14. In one embodiment, the electronic control unit 12 is secured to the latch assembly 14 by fasteners 20 such as screws.

Figure 5:
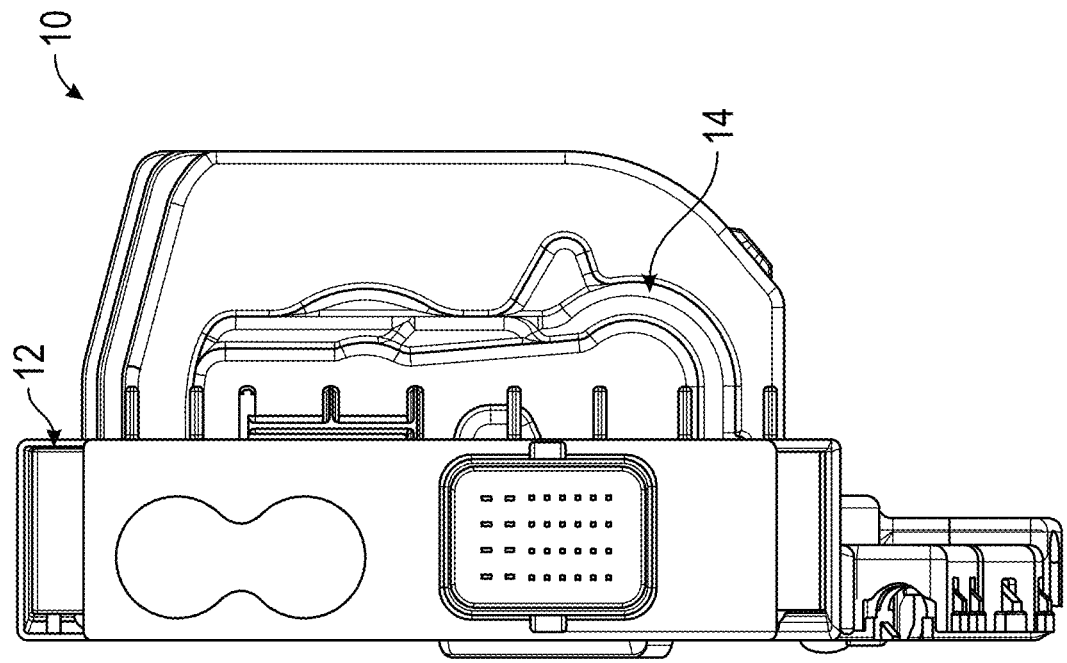
FIGS. 4 and 5 are views of a modular electronic control unit (ECU) or electronic control unit (ECU) secured to a vehicle latch or latch assembly.
Figure 4:
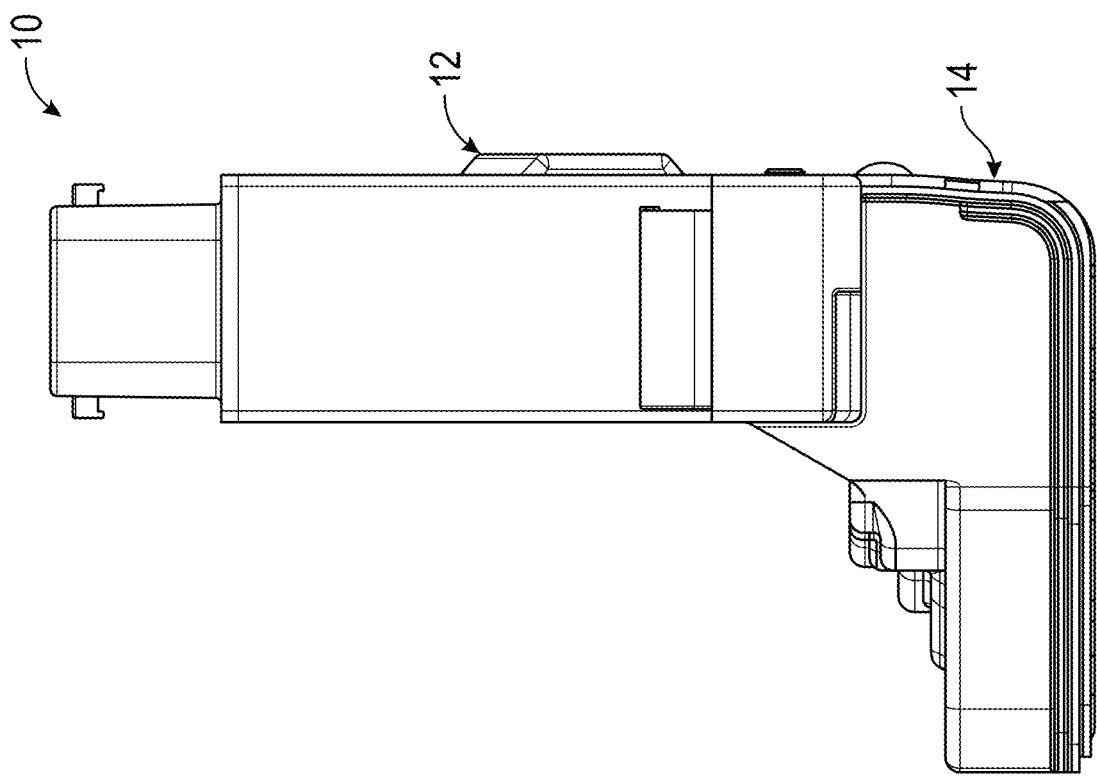

FIGS. 4 and 5 are views illustrating the modular ECU 12 secured to the latch assembly 14. FIGS. 6 and 7 are perspective views of the electronic control unit 12.

Figure 8:
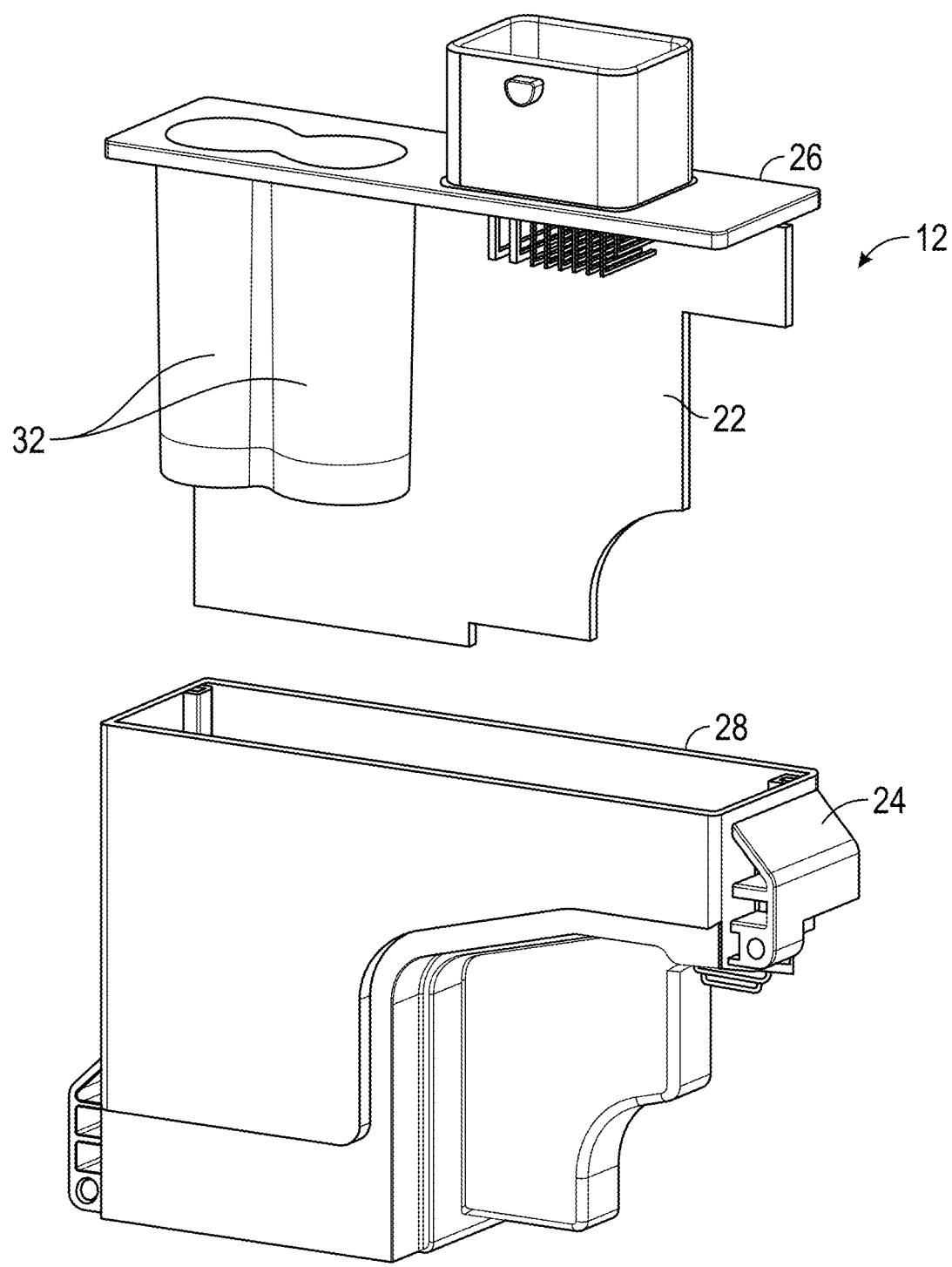
FIG. 8 illustrates a printed circuit board being and the housing of the electronic control unit (ECU)

FIG. 8 illustrates a printed circuit board (PCB) assembly 22 for securement into a housing 24 of the ECU 12. The printed circuit board (PCB) assembly 22 includes a cover portion 26 that is secured to an opening 28 of the housing 24. In one embodiment, a seal is located on a periphery of the opening 28 of the housing and the seal is configured to prevent moisture from entering an interior of the housing when the cover 26 is secured to the housing. In one embodiment, the seal may be made from any suitable material (elastomeric or otherwise) in order to provide the aforementioned sealing features.

In one non-limiting embodiment, the housing 24 and the cover 26 may be formed from an easily moldable material such as plastic or any other suitable polymeric materials.

Figure 9:
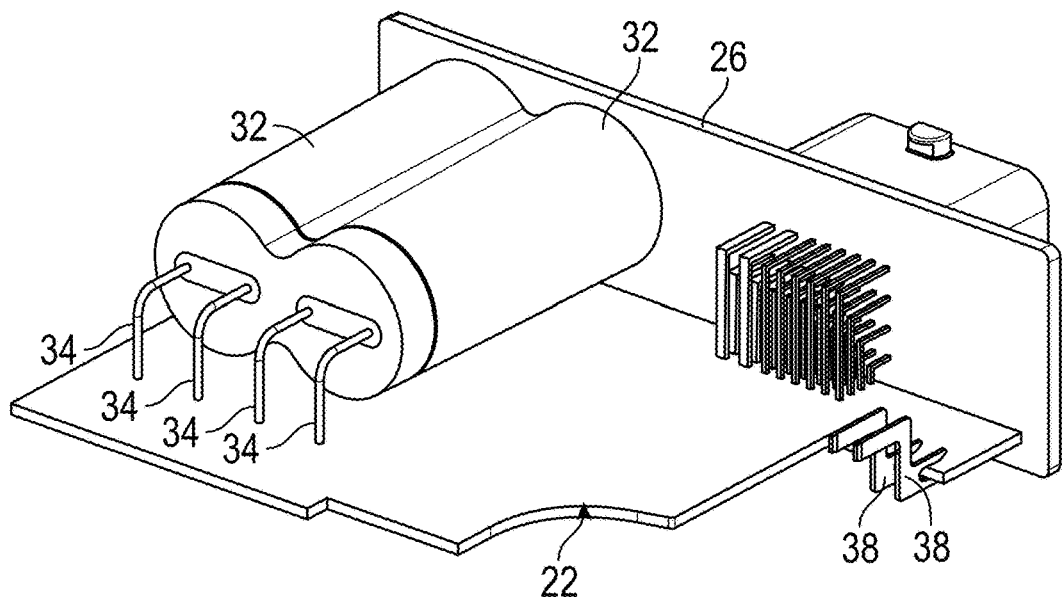
FIGS. 9 and 10 illustrate the printed circuit board of the electronic control unit (ECU)
Figure 10:
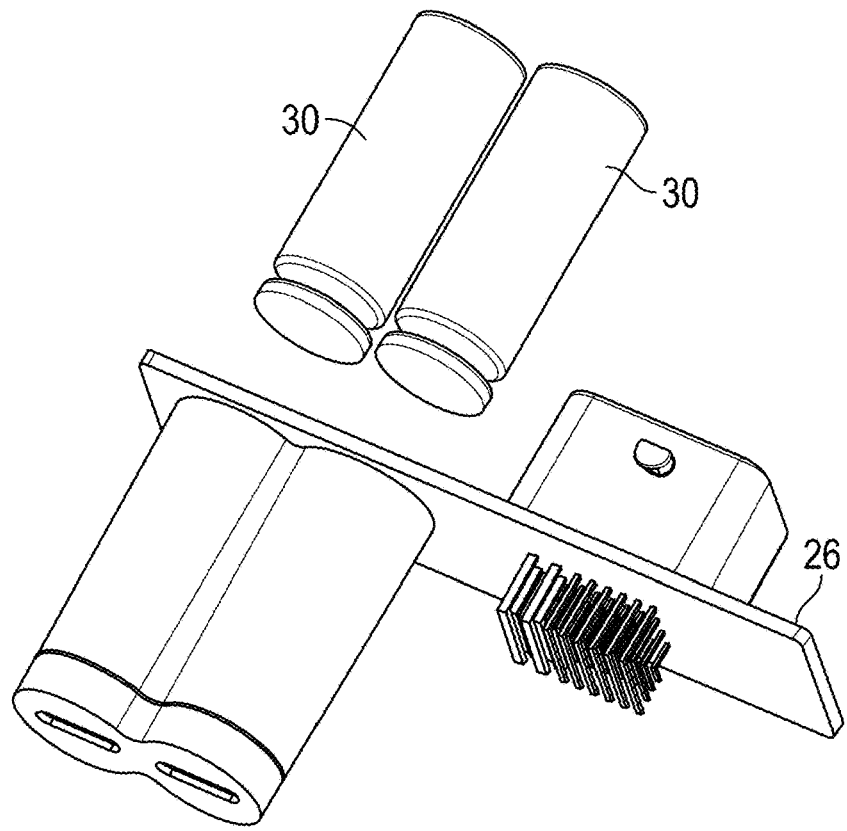
Figure 11:
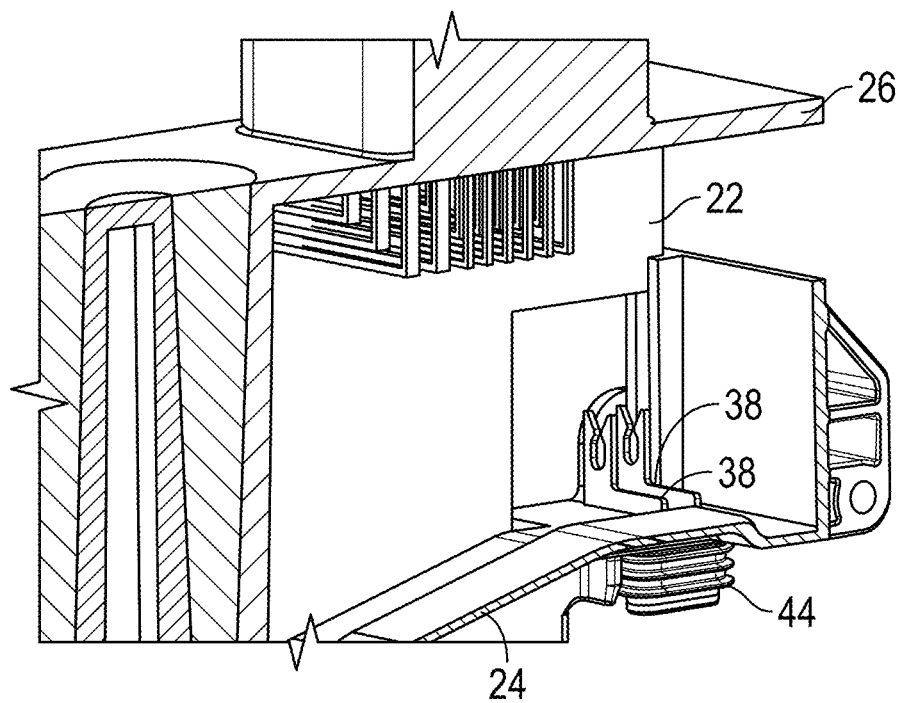
FIGS. 11-13 are partial cross-sectional views of the electronic control unit (ECU)
Figure 12:
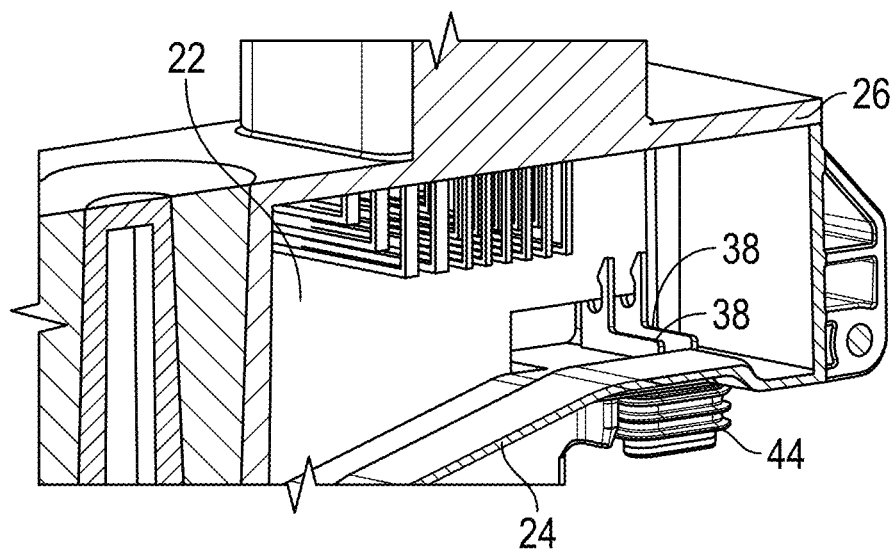
Figure 13:
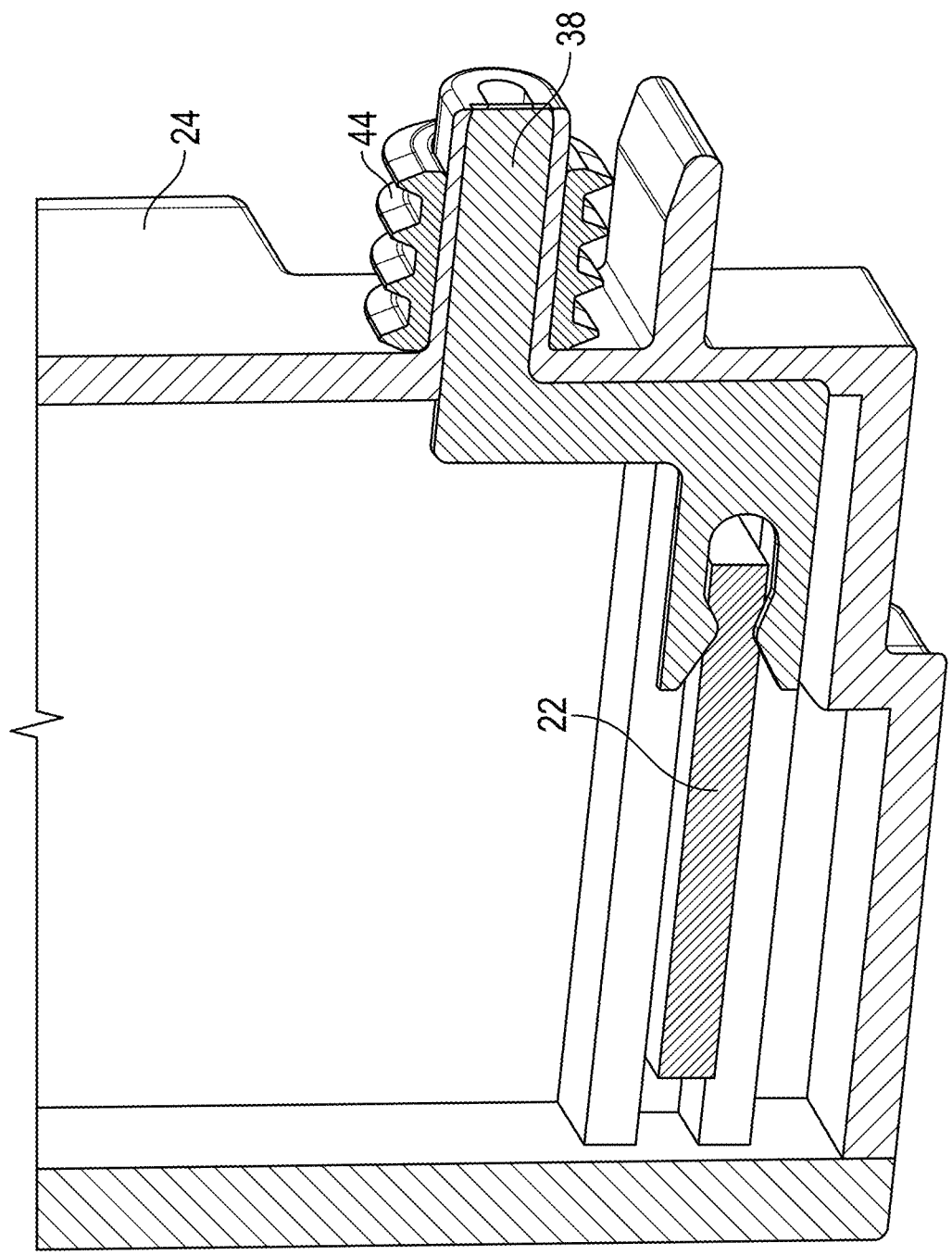
Figure 14:
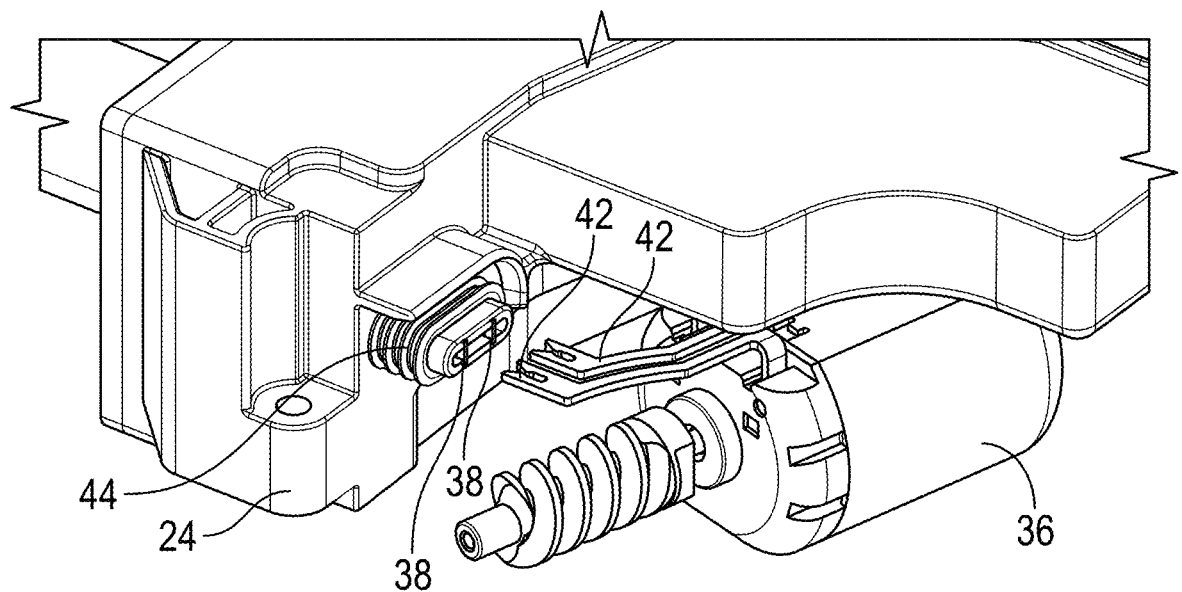
FIGS. 14-15 are partial perspective views of the electronic control unit (ECU) and a motor of the latch.
Figure 15:
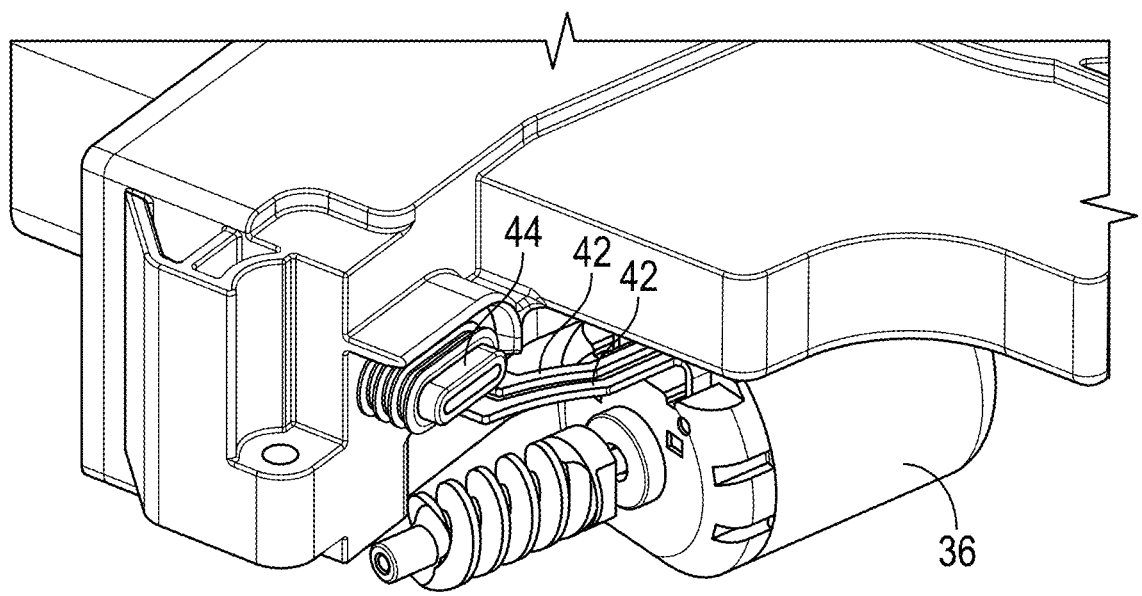
Figure 16:
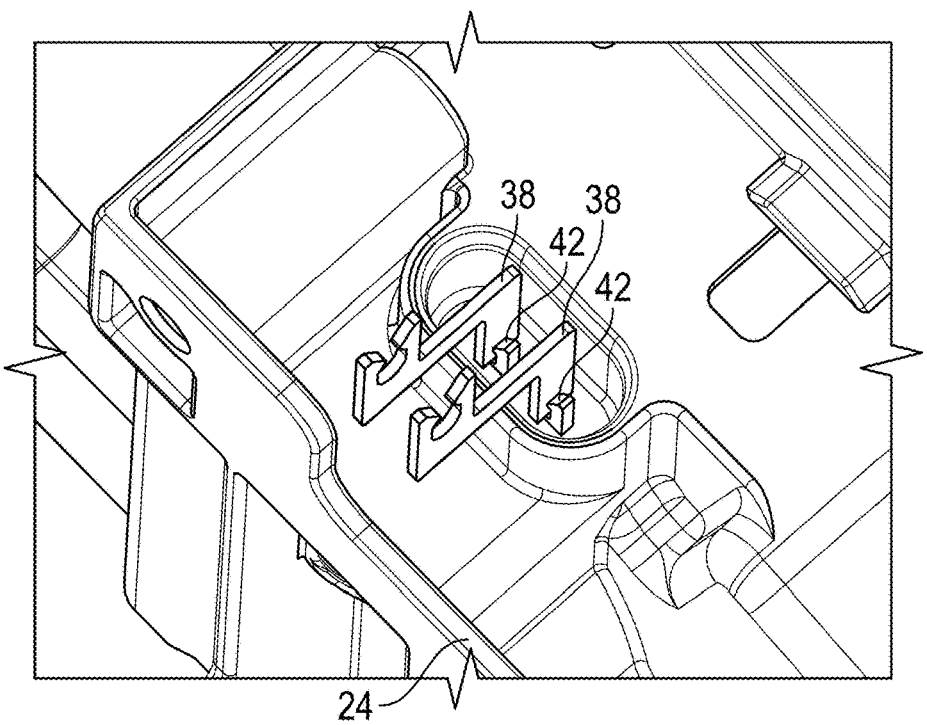
FIG. 16 is a partial perspective view of the electronic control unit (ECU) and the electrical connector for a motor of the latch.
Figure 17:
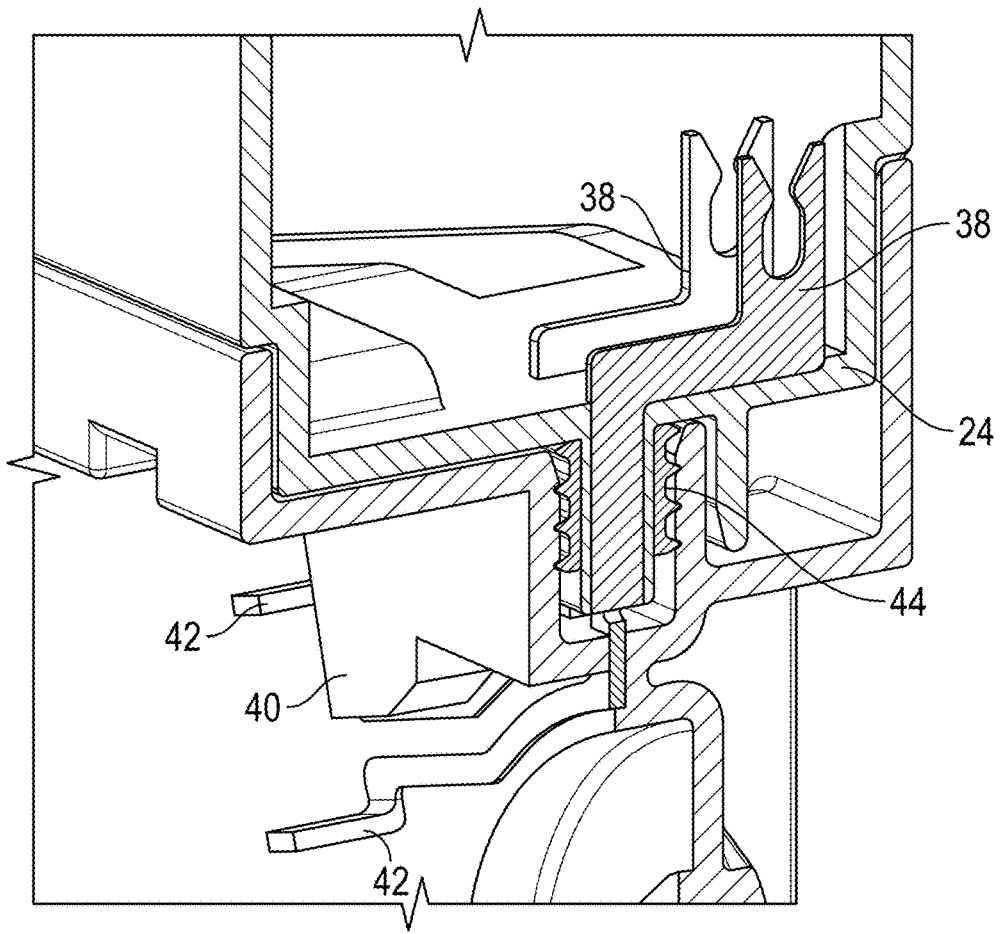
FIG. 17 is a partial perspective cross-sectional view of the electronic control unit (ECU) and the electrical connector for a motor of the latch.
Figure 18:
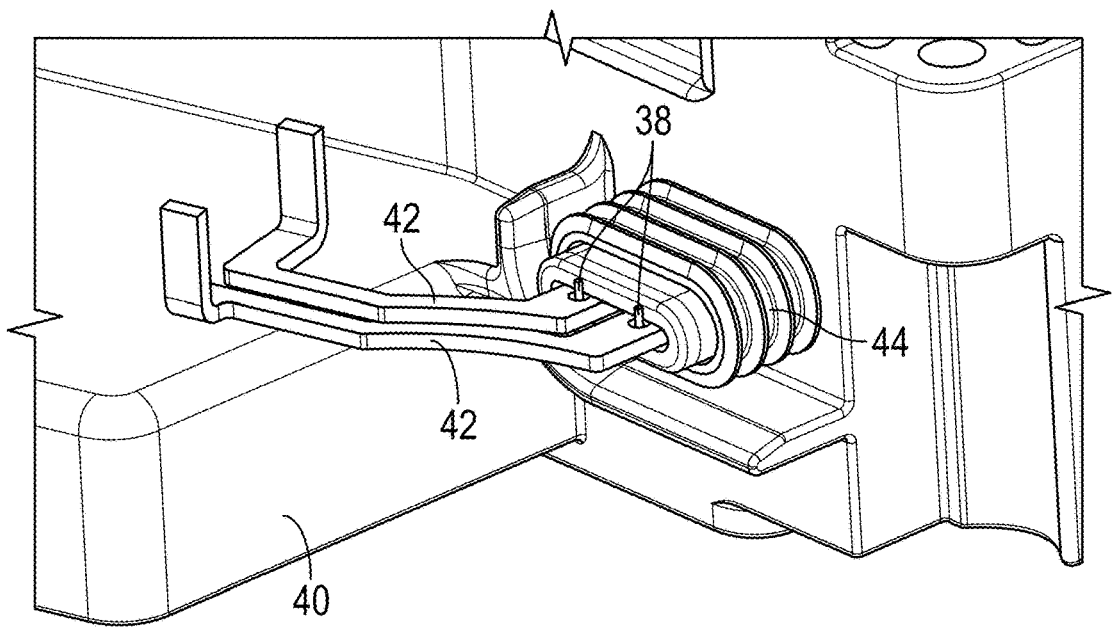
FIGS. 18 and 19 are partial perspective views of the electronic control unit (ECU) and the electrical connector for a motor of the latch.
Figure 19:
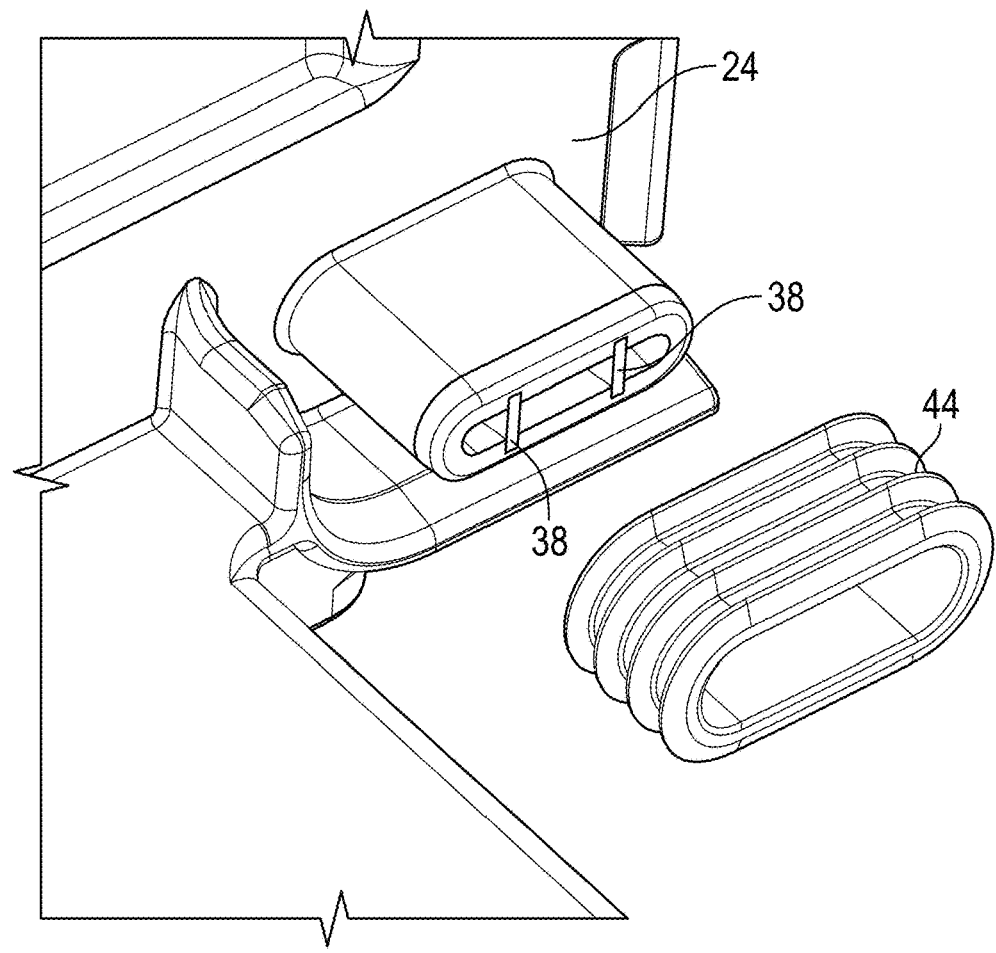
Figure 20:
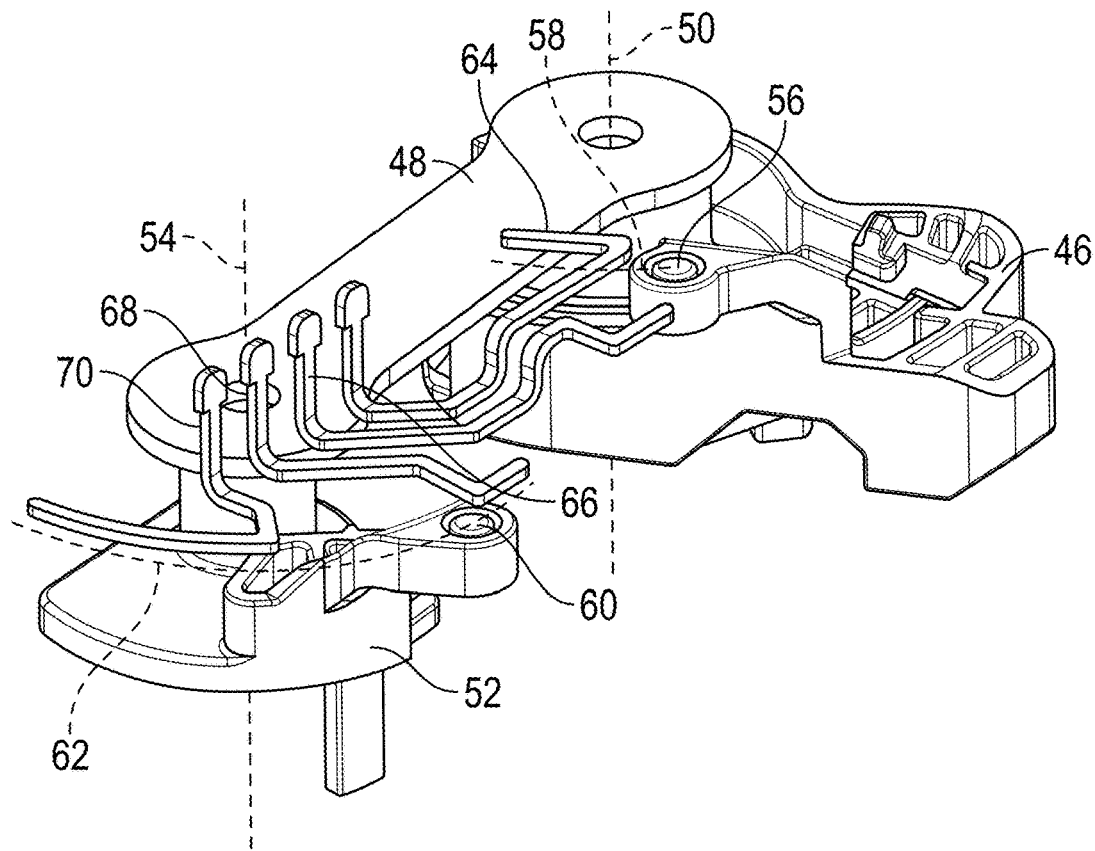
FIGS. 20-23 are views of latch components and metal traces for use with magnets and Hall-effect sensors of the latch assembly.
Figure 21:
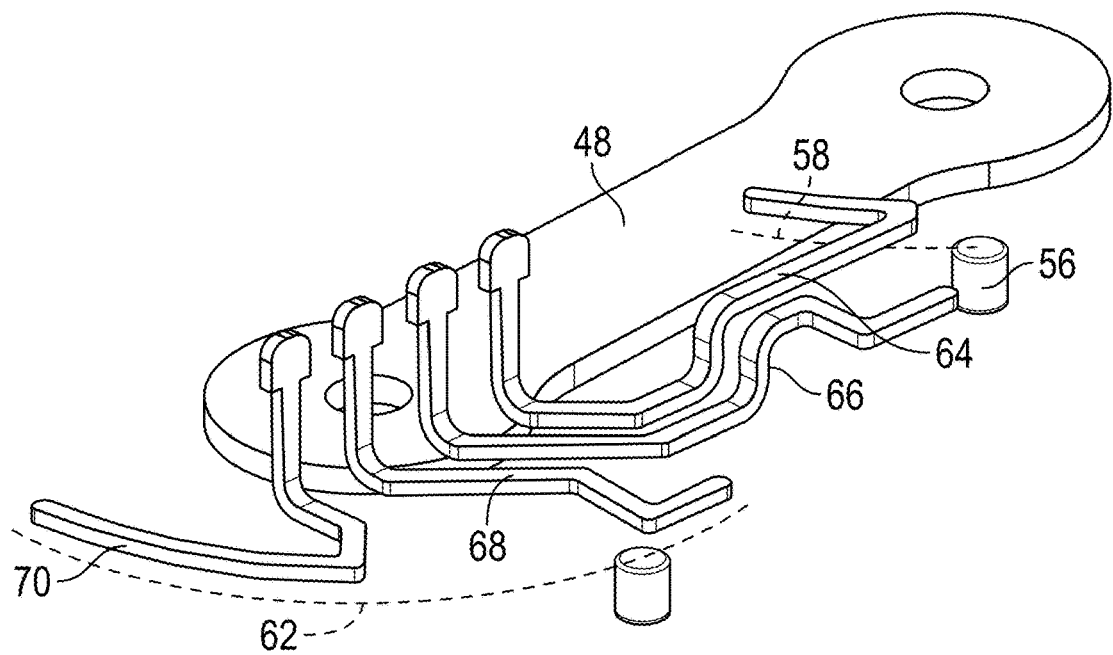
Figure 22:
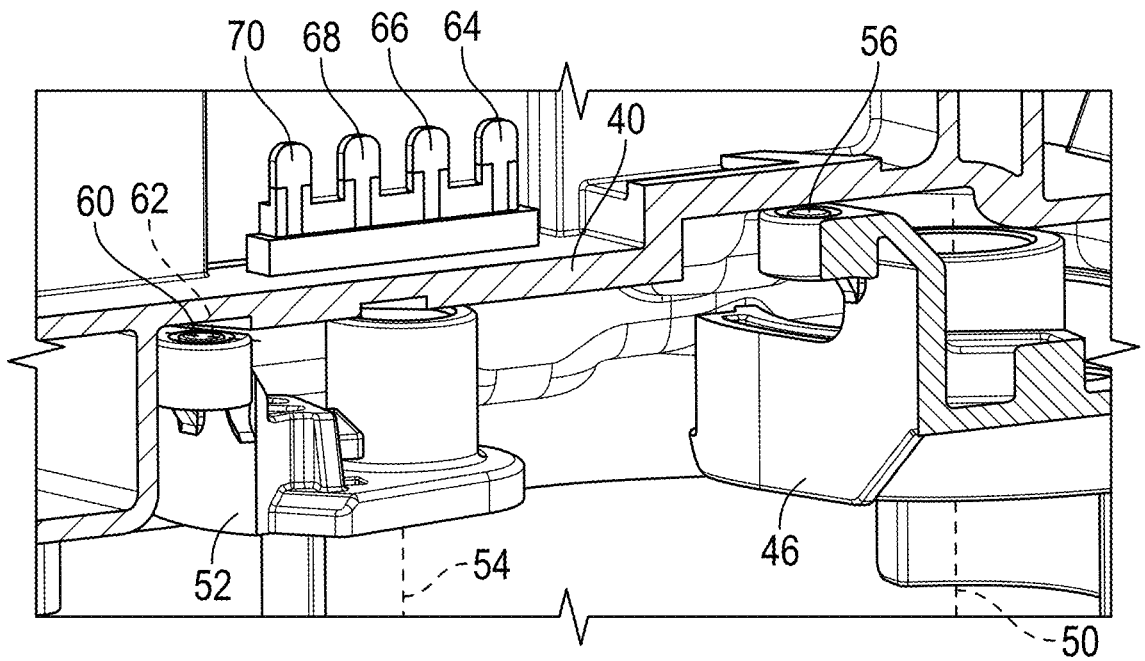
Figure 23:
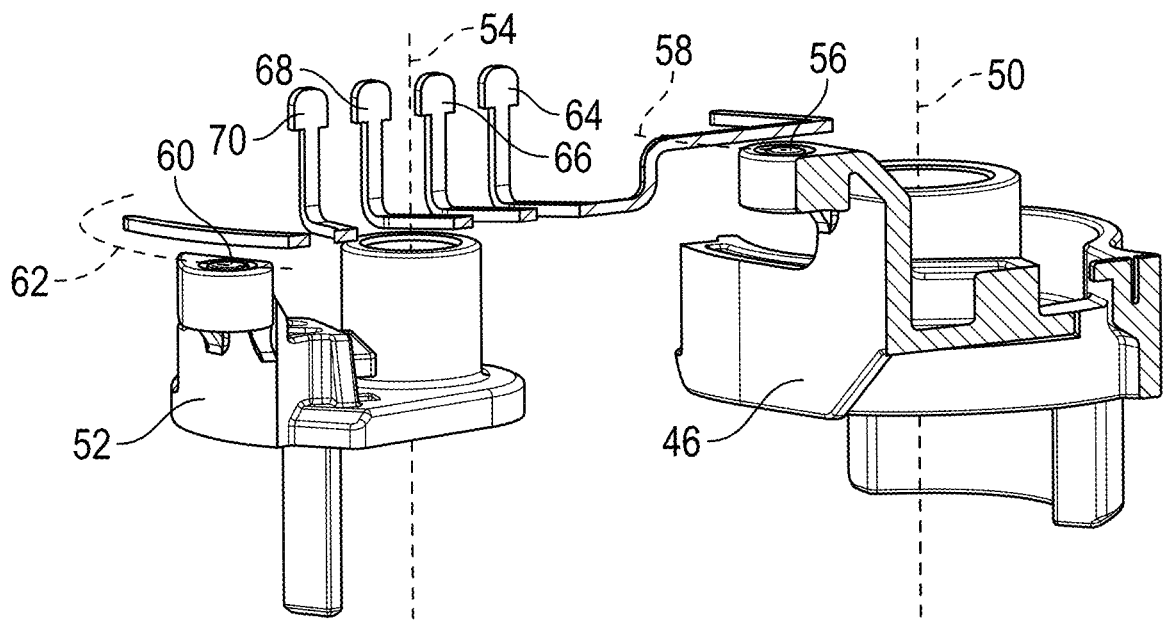
Figure 24:
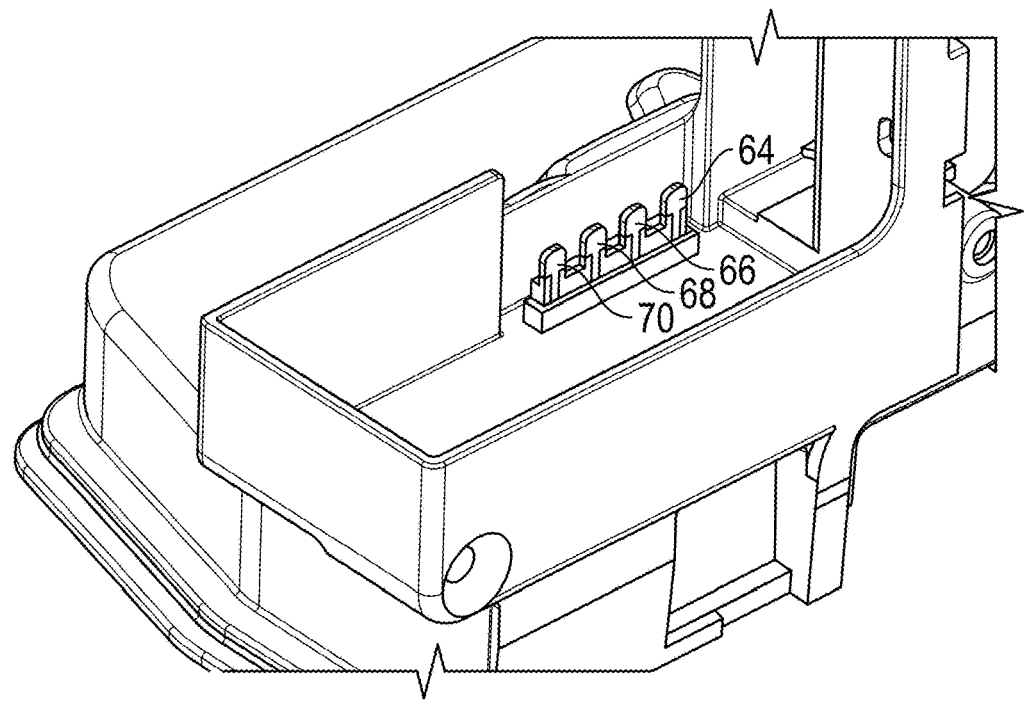
FIGS. 24-28 are views of metal traces and Hall-effect sensors of the latch assembly.
Figure 25:
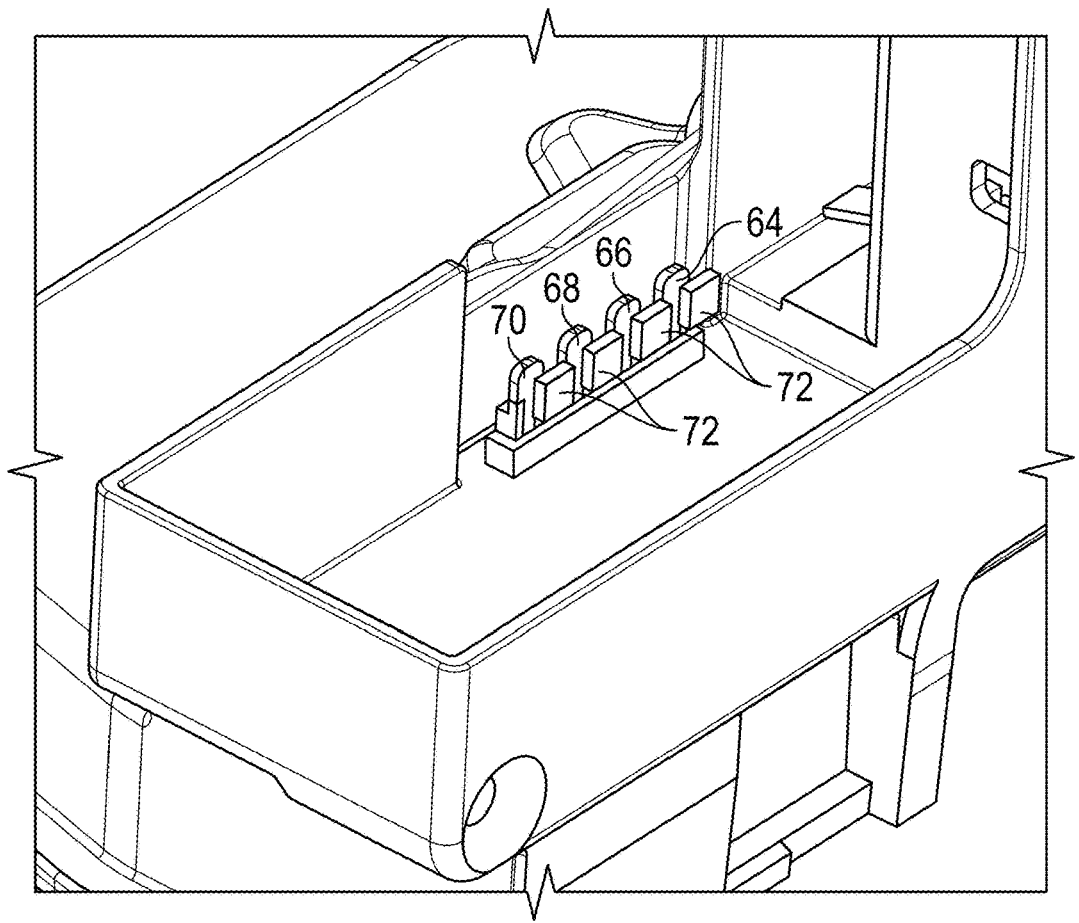
Figure 26:
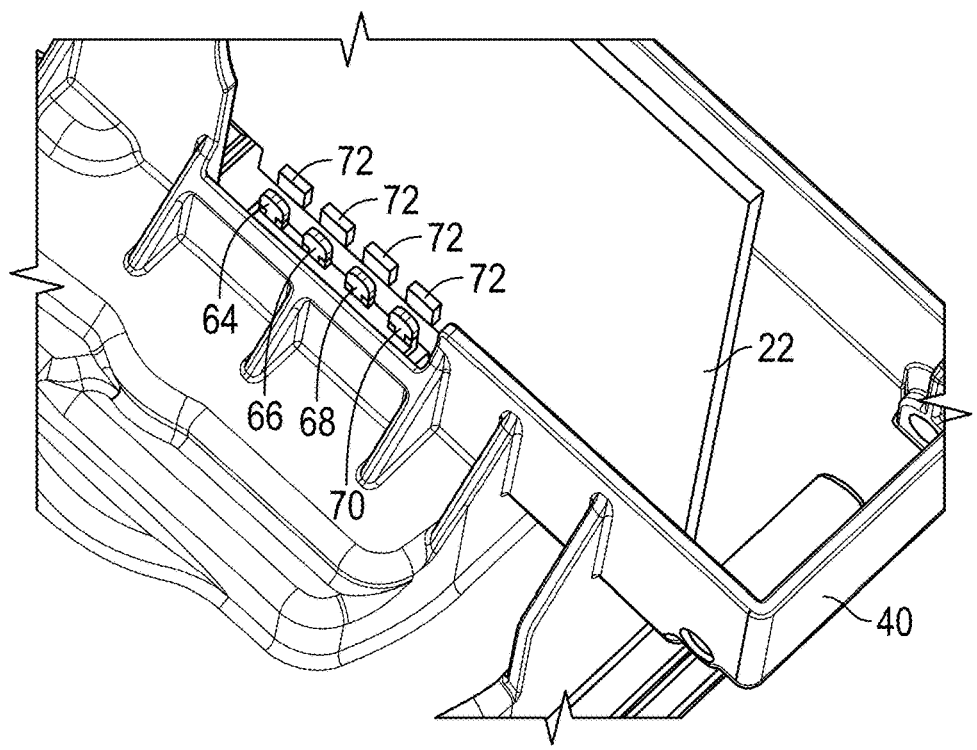
Figure 27:
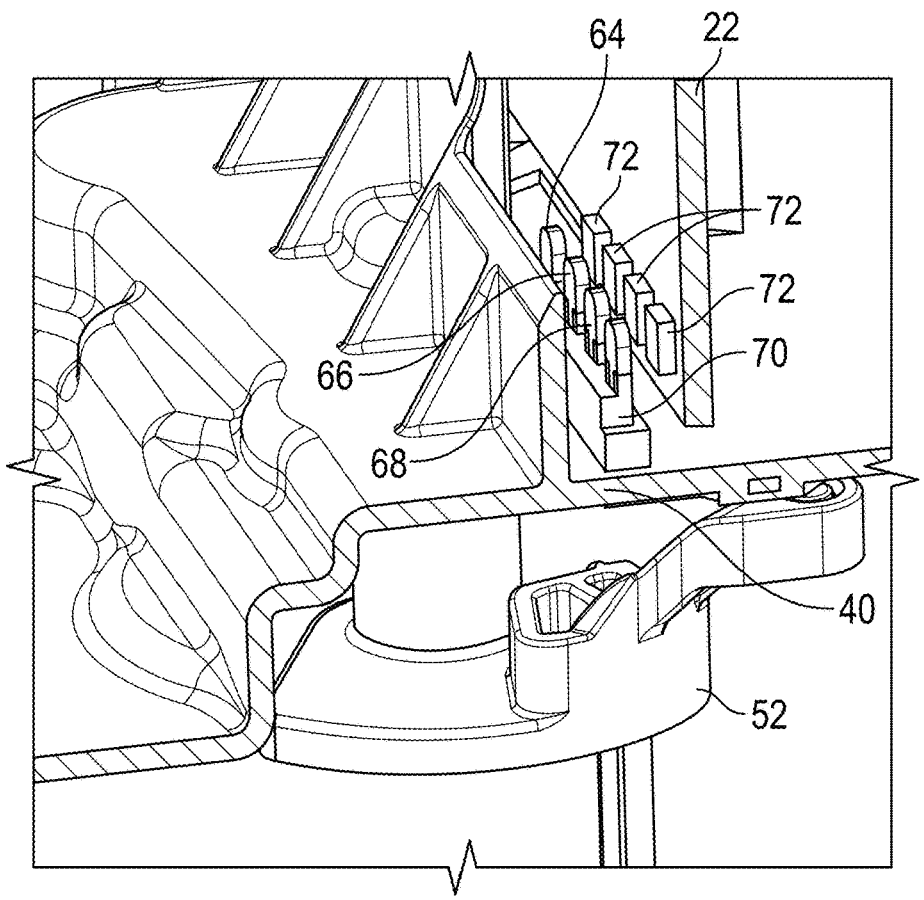
Figure 28:
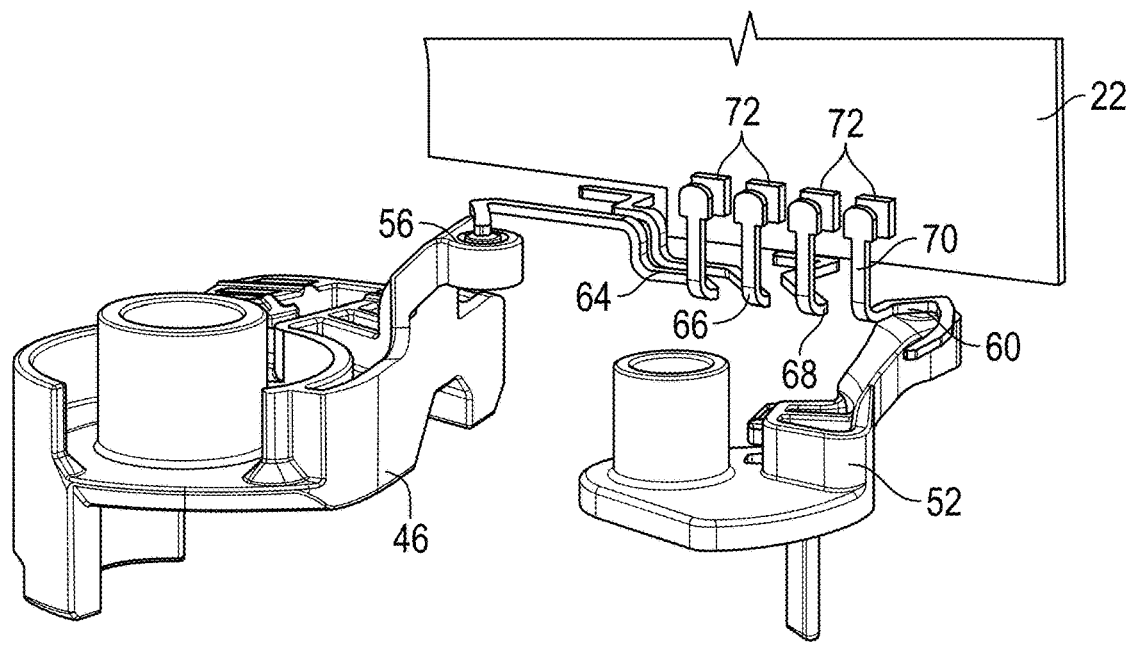
Figure 29:
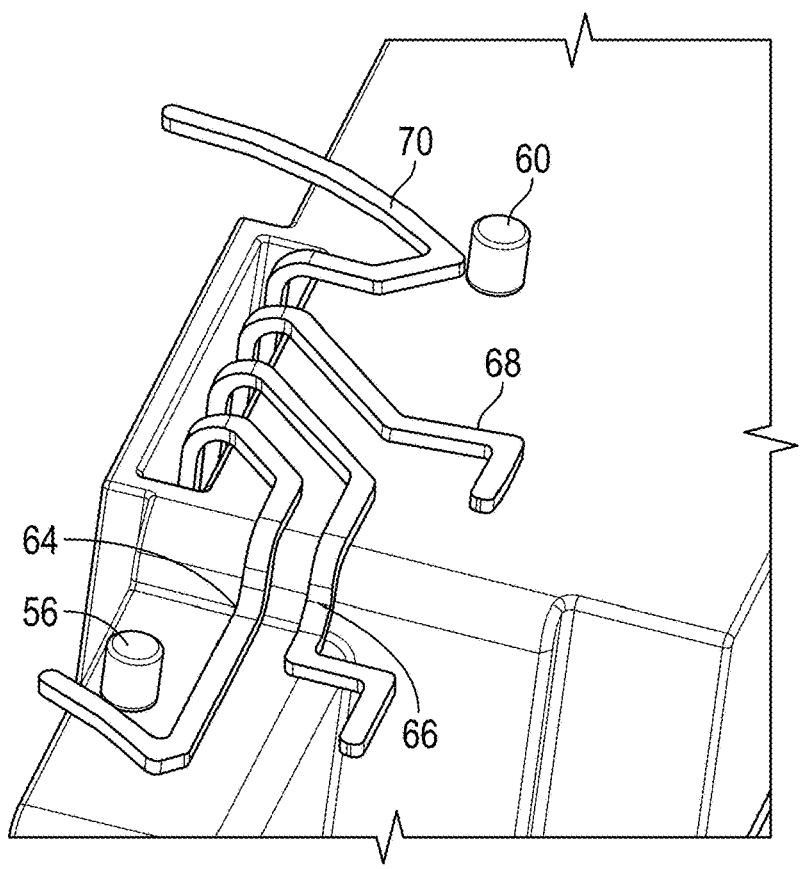
FIG. 29 is a perspective view of metal traces and magnets for use with Hall-effect sensors of the latch assembly.
Figure 30:
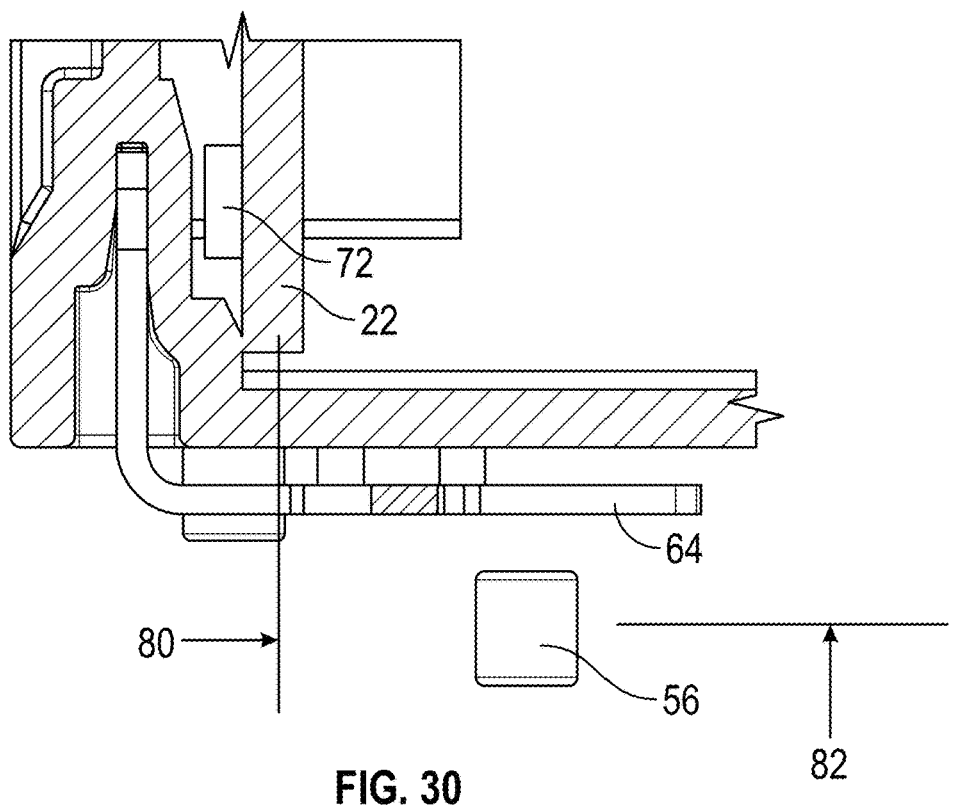
FIGS. 30-32 are partial cross-sectional views of the latch assembly.
Figure 31:
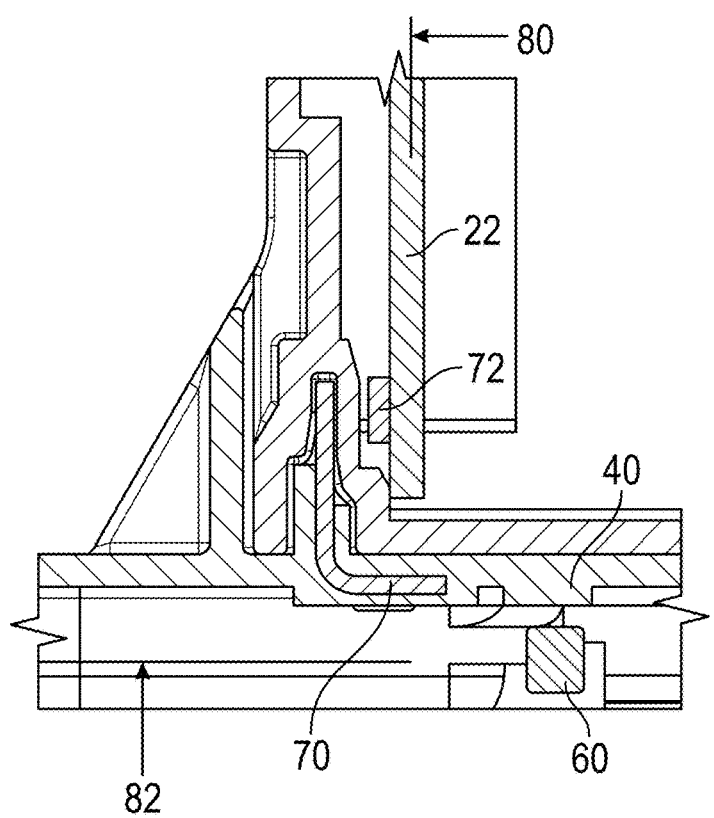
Figure 32:
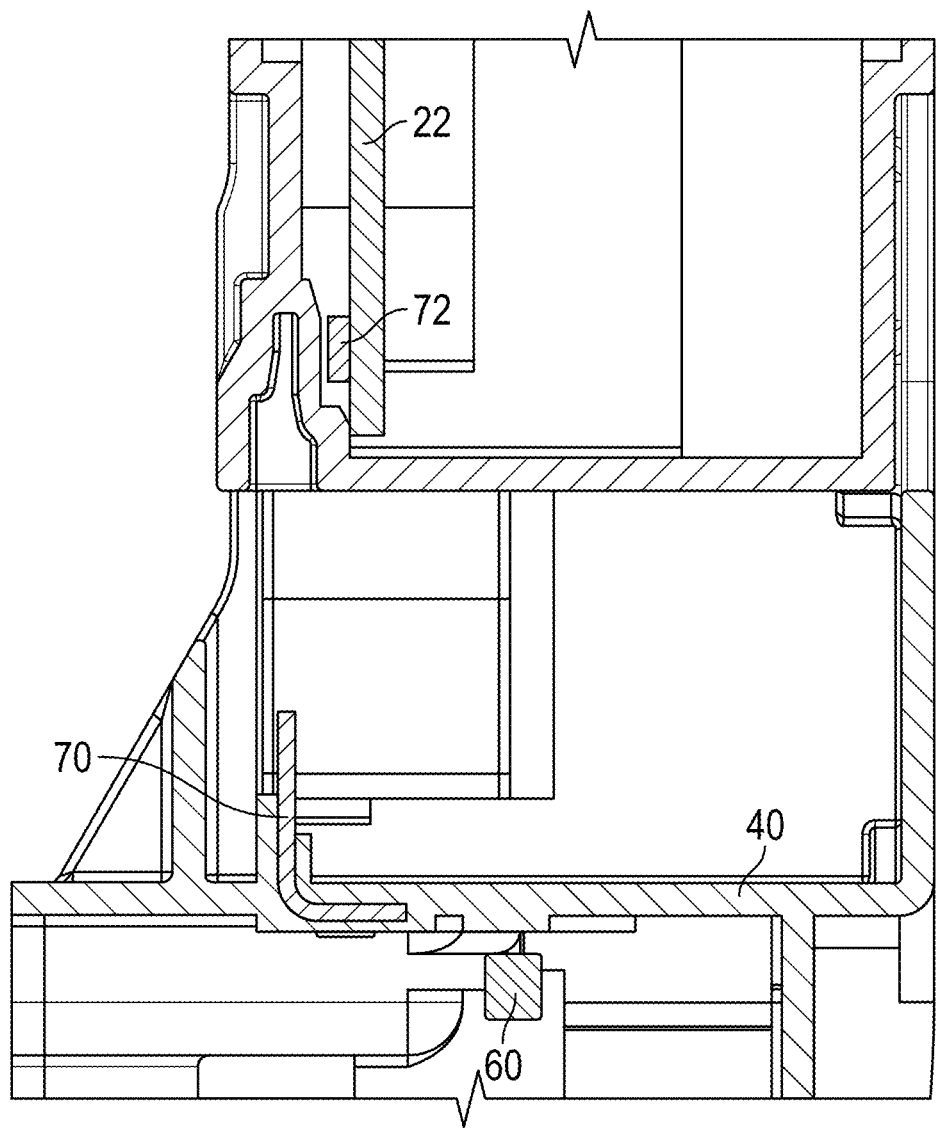

FIGS. 9 and 10 are perspective views of the printed circuit board (PCB) assembly 22 when it is removed from the housing 24 of the ECU 12.

In addition and in one non-limiting alternative embodiment, the printed circuit board assembly 22 may have an independent power source or an integral source of power 30 such as super capacitor(s) 30 or a battery 30 that will provide backup power in the event of a power loss to the vehicle latch system 10 the ECU 12 is installed in. In one embodiment, the printed circuit board assembly 22 will have at least one super capacitor 30 or capacitor 30 that provides backup power to the ECU 12. As used herein a super capacitor is intended to refer to a high-capacity capacitor that has capacitance values much higher than other capacitors and can accept and deliver charge much faster than batteries, and can tolerate many more charge and discharge cycles than rechargeable batteries. Alternatively, a battery may be employed instead of or in combination with capacitor 30.

As mentioned above, the super capacitors 30 may oriented horizontally to the printed circuit board (PCB) 22 and/or they may be retained in the cover 26 of the electronic control unit (ECU). This allows for height of the package of the electronic control unit (ECU) to increase only by the diameter of the capacitors 30 as opposed to their height, which can be 2-3 times larger than the diameter. As such and in one non-limiting embodiment, a height of the capacitor(s) extends parallel to the printed circuit board assembly and a diameter of the capacitor(s) extend perpendicular to the printed circuit board assembly.

As illustrated, the cover 26 of the electronic control unit (ECU) 12 has housing portion or portions 32 that acts as a cartridge for the super capacitors 30 where they are sealed, potted, or glued into place, and then the terminals 34 of the super capacitors 30 are bent 90 degrees and soldered to the printed circuit board (PCB) or alternatively they can be connected using a bus bar or other connection method.

The printed circuit board assembly 22 will also have controller(s) or microcontroller(s) or microprocessor(s) (not shown) as well as the necessary electrical traces in order to operate the vehicle latch system 10 when the ECU 12 is secured thereto and the latch is operating as an E-latch or electronic latch.

The printed circuit board assembly 22 may also be referred to as a door latch controller 22 or latch controller 22 or electronic latch controller 22 that comprises a microprocessor, microcontroller or other equivalent processing device capable of executing commands of computer readable data or program for executing a control algorithm that controls the operation of the vehicle latch systems 10. Moreover, the microprocessor, microcontroller or other equivalent processing device is capable of being programmed in order to provide the various control features described herein (e.g., door latch controller 22 or latch controller 22 or electronic latch controller 22 and/or door unit controller 22).

In order to perform the prescribed functions and desired processing, as well as the computations therefore (e.g., the execution of fourier analysis algorithm(s), the control processes prescribed herein, and the like), the controller may include, but not be limited to, a processor(s), computer(s), memory, storage, register(s), timing, interrupt(s), communication interfaces, and input/output signal interfaces, as well as combinations comprising at least one of the foregoing. For example, the controller may include input signal filtering to enable accurate sampling and conversion or acquisitions of such signals from communications interfaces.

In addition and in other embodiments the printed circuit board assembly 22 or door latch controller or electronic latch controller 22 may also be configured to control other features of a vehicle door to which the latch is secured to. Non-limiting examples of these features include operation of a window regulator, side view mirrors, lighting, ect. As such, the printed circuit board assembly 22 or door latch controller 22 may also be configured to operate as door unit controller 22.

Since the printed circuit board includes a microprocessor, microcontroller or other equivalent processing device it can be programmed to execute commands of computer readable data or a program for executing a control algorithm that controls the operation of the vehicle latch and/or other components of a vehicle door the latch 14 is secured to. Therefore, the ECU 12 and the printed circuit board 22 may be configured to serve as a hub for other vehicle door electronics in addition to the operation of the latch 14.

Referring now to at least FIGS. 9 and 11-19 and in order to provide power to a motor(s) 36 of the vehicle latch system 10, the housing 24 of the electronic control unit 12 has a first pair of terminals 38 over-molded into the housing 24. The first pair of terminals 38 are configured to press fit to the printed circuit board 22 during assembly of the printed circuit board into the housing 24 such that the printed circuit board 22 is electrically coupled to the first pair of terminals, and these terminals 38 protrude outside of the housing 24, while a cover 40 of the latch assembly 14 has a second pair of terminals 42 over-molded into the cover 40 that electrically connect to the motor 36 and protrude out of the latch cover 40. When the electronic control unit 12 is assembled to the latch assembly 14 these terminals 38, 42 have a press fit or interference fit or interface connection with each other and a sealed connector shroud 44 is located around them to keep water out, allowing for a sealed connection between the modular electronic control unit (ECU) 12 and the latch assembly 14.

Referring now to at least FIGS. 20-32 a communication system between the latch components and Hall-effect sensors located on an electronic circuit carrier (ECC) or printed circuit board 22 located within the electronic control unit (ECU) 12. As illustrated, a first lever 46 is rotatably or pivotally mounted to a back plate 48 for rotation about an axis or first axis 50 and a second lever 52 is rotatably or pivotally mounted to the back plate 48 for rotation about an axis or second axis 54. The first axis being in a different location with respect to the second axis. The first lever 46 may be operably coupled to a forkbolt or claw 46 of the latch assembly 14 has a magnet 56 secured thereto and magnet 56 moves along a path or arc illustrated by line 58 as the first lever 46 rotates or pivots about axis 50. The second lever 52 is operably coupled to a detent lever or pawl of the latch assembly 14 and has a magnet 60 secured thereto and magnet 60 moves along a path or arc illustrated by line 62 as the detent lever or pawl 52 rotates or pivots about axis 54.

As such, the magnets 56, 60 are directly mounted on movable levers 46, 52 internal to the latch assembly 14. The positions of these movable levers 46, 52 correspond to the movement or location of the forkbolt or claw and the detent lever or pawl of the latch. As such, their location is required to be known by electronic control unit (ECU) thus, they require sensing. Instead of locating the magnets directly underneath the Hall-effect sensor(s) of the electronic control unit (ECU), they are positioned to move underneath steel (or other ferrous material) traces 64, 66, 68 and 70. These traces are over-molded into the latch cover 40 (or additional carrier component) and are designed to cover the travel of the magnets 56, 60 where a signal change is required. As such, the steel (or other ferrous material) of the traces 64, 66, 68 and 70 transfers the magnetic field and location thereof to Hall-effect sensors 72 located on the printed circuit board 22. For example, distal ends of these traces 64, 66, 68 and 70 opposite to distal ends located proximate to the path of travel of the magnets 56 and 60 are configured to be positioned adjacent to Hall-effect sensors 72 located on the printed circuit board 22 when the electronic control unit (ECU) 12 is secured to the latch assembly 14. This may be achieved by having these distal ends pass through an opening 74 located in a bottom portion 76 of the housing 24 when it is received in a cavity 78 of the latch housing or latch cover 40. The configuration of cavity 78 and housing 24 allows for a seal to be made between the ECU 12 and the latch assembly 14 so no containments (e.g., water, dust, etc.) can pass through opening 74 when the ECU 12 is secured to the latch assembly 14.

As illustrated, the traces 64, 66, 68 and 70 would cover a portion of the travel of the magnet, and then extend off to a location where the Hall-effect sensor is able to pick up the magnet field coming off of the trace when it becomes magnetized, by movement of the lever the magnet is secured to. This means that although the printed circuit board (PCB) of the electronic control unit (ECU) may be on a different plane 80, or in an offset location from the magnets or in a plane not parallel to a plane 82 the magnets move in, it can still detect the change in magnetic field as the lever moves into various positions.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A vehicle latch system, comprising:
   a latch assembly;
   an electronic control unit removably attached to an exterior of a housing of the latch assembly, the electronic control unit having a printed circuit board assembly secured into a housing of the electronic control unit, wherein the printed circuit board assembly when inserted into the housing of the electronic control unit is press fit into electrical communication with a first pair of terminals molded into the housing of the electronic control unit, wherein the first pair of terminals are configured to have an interference fit with a second pair of terminals molded into a housing of the latch assembly when the electronic control unit is secured to the latch assembly;
   a communication system between a first lever pivotally mounted to a back plate for rotation about a first axis and a second lever is pivotally mounted to the back plate for rotation about a second axis, the first axis being at a different location than the second axis and Hall-effect sensors located on the printed circuit board assembly, wherein the communication system further comprises a plurality of metal traces that transfer a magnetic field of a magnet located on the first lever to the Hall-effect sensors located on the printed circuit board assembly and a magnetic field of a magnet located on the second lever as the first lever pivots about the first axis and the second lever pivots about the second axis.

2. The vehicle latch system as in claim 1, wherein the metal traces are formed from steel.

3. The vehicle latch system as in claim 1, wherein the printed circuit board assembly is located in a plane offset or not parallel to a plane the magnets move in.

4. The vehicle latch system as in claim 1, wherein the second pair of terminals are electrically coupled to a motor of the latch assembly.

5. The vehicle latch system as in claim 4, wherein the printed circuit board assembly includes a cover portion that is secured to an opening of the housing of the electronic control unit.

6. The vehicle latch system as in claim 5, wherein the cover portion and the housing of the electronic control unit is formed plastic.

7. The vehicle latch system as in claim 1, wherein the printed circuit board assembly has an integral source of power.

8. The vehicle latch system as in claim 7, wherein the integral source of power is a capacitor.

9. The vehicle latch system as in claim 8, wherein the capacitor is oriented horizontally with respect to the printed circuit board assembly, such that a height of the capacitor extends parallel to the printed circuit board assembly and a diameter of the capacitor extend perpendicular to the printed circuit board assembly and a cover of the electronic control unit has a housing portion for the capacitor to be secured to.

10. A method of communicating a location of a component of a latch assembly to an electronic control unit removably secured to an exterior of a housing of the latch assembly, the electronic control unit having a printed circuit board assembly secured into a housing of the electronic control unit, wherein the printed circuit board assembly when inserted into the housing of the electronic control unit is press fit into electrical communication with a first pair of terminals molded into the housing of the electronic control unit, wherein the first pair of terminals are configured to have an interference fit with a second pair of terminals molded into a housing of the latch assembly when the electronic control unit is secured to the latch assembly, the method comprising:

molding a plurality of metal traces into a cover of the housing of the latch assembly;

securing the electronic control unit to the exterior of the housing;

detecting a magnetic field of a magnet located on a first lever pivotally mounted to a back plate of the latch assembly for rotation about a first axis via a Hall-effect sensor located on a printed circuit board assembly of the electronic control unit with one of the plurality of metal traces as the first lever moves about the first axis; and detecting a magnetic field of a magnet located on a second lever pivotally mounted to the back plate of the latch assembly for rotation about a second axis via a Hall-effect sensor located on the printed circuit board assembly of the electronic control unit with another one of the plurality of metal traces as the second lever moves about the second axis.

\* \* \* \* \*